US012787852B2

(12) United States Patent
Kim et al.

(10) Patent No.: US 12,787,852 B2
(45) Date of Patent: Nov. 3, 2026

(54) SEMICONDUCTOR PACKAGE AND METHOD FOR MANUFACTURING THE SAME

(71) Applicant: SAMSUNG ELECTRONICS CO., LTD., Suwon-si (KR)

(72) Inventors: Jinyoung Kim, Suwon-si (KR); Wonbin Shin, Suwon-si (KR); Kiseok Kim, Suwon-si (KR); Jihye Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 398 days.

(21) Appl. No.: 18/374,123

(22) Filed: Sep. 28, 2023

(65) Prior Publication Data

US 2024/0194553 A1 Jun. 13, 2024

(30) Foreign Application Priority Data

Dec. 12, 2022 (KR) ........................ 10-2022-0173045

(51) Int. Cl.

| | |
|---|---|
| ***H10W 74/10*** | (2026.01) |
| ***H10B 80/00*** | (2026.01) |
| ***H10W 70/60*** | (2026.01) |
| ***H10W 70/685*** | (2026.01) |
| ***H10W 72/00*** | (2026.01) |
| ***H10W 72/30*** | (2026.01) |
| ***H10W 72/90*** | (2026.01) |

(Continued)

(52) U.S. Cl.

CPC .......... *H10W 74/121* (2026.01); *H10B 80/00* (2023.02); *H10W 70/685* (2026.01); *H10W 74/476* (2026.01); *H10W 90/00* (2026.01); *H10W 90/701* (2026.01); *H10W 70/60* (2026.01); *H10W 72/0198* (2026.01); *H10W 72/354* (2026.01); *H10W 72/823* (2026.01); *H10W 72/9415* (2026.01); *H10W 80/312* (2026.01); *H10W 80/327* (2026.01); *H10W 80/743* (2026.01); *H10W 90/297* (2026.01); *H10W 90/722* (2026.01); *H10W 90/724* (2026.01); *H10W 90/734* (2026.01); *H10W 90/792* (2026.01); *H10W 90/794* (2026.01)

(58) Field of Classification Search

CPC ............................ H10B 80/00; H10W 70/685

See application file for complete search history.

(56) References Cited

U.S. PATENT DOCUMENTS 10,090,272 B2 10/2018 Wang et al.
10,861,808 B2 12/2020 Chen et al.
(Continued)

*Primary Examiner* — Matthew L Reames
(74) *Attorney, Agent, or Firm* — Muir Patent Law, PLLC

(57) ABSTRACT

A semiconductor package includes a first chip including a first substrate, a first wiring layer on the first substrate, and a plurality of through-electrodes to be connected to the first wiring layer and protruding from a lower surface of the first substrate, a double gap-fill layer covering a side surface and a lower surface of the first chip and a protruding portion of the through-electrode and having a double layer structure, a second chip disposed on the first chip and the double gap-fill layer, including a second wiring layer and a second substrate on the second wiring layer, and bonded to the first chip by hybrid bonding, and a bump on a lower surface of the first chip and connected to the through-electrode.

19 Claims, 32 Drawing Sheets

(51) Int. Cl.

| | |
|---|---|
| ***H10W 74/47*** | (2026.01) |
| ***H10W 80/00*** | (2026.01) |
| ***H10W 90/00*** | (2026.01) |
| ***H10W 90/20*** | (2026.01) |

(56) References Cited

U.S. PATENT DOCUMENTS

| | | | | |
|---|---|---|---|---|
| 11,024,605 | B2 | 6/2021 | Chen et al. | |
| 11,152,274 | B2 | 10/2021 | Lee et al. | |
| 11,239,225 | B2 | 2/2022 | Chen et al. | |
| 2019/0103375 | A1* | 4/2019 | Huang | H10P 72/74 |
| 2021/0134704 | A1 | 5/2021 | Chen et al. | |
| 2021/0375819 | A1 | 12/2021 | Chen et al. | |

* cited by examiner

SEMICONDUCTOR PACKAGE AND METHOD FOR MANUFACTURING THE SAME

CROSS-REFERENCE TO RELATED APPLICATION

This application is based on and claims priority under 35 U.S.C. § 119 to Korean Patent Application No. 10-2022-0173045, filed on Dec. 12, 2022, in the Korean Intellectual Property Office, the disclosure of which is incorporated by reference herein in its entirety.

BACKGROUND

1. Field

Embodiments relate to a semiconductor package, and more particularly, to a semiconductor package in which two chips are directly stacked by hybrid bonding, and a method for manufacturing the semiconductor package.

2. Description of the Related Art

In accordance with the rapid development of the electronics industry and the needs of users, electronic devices have become more compact and lightweight. Accordingly, semiconductor packages used therein have also become compact and lightweight and characteristics such as high reliability along with high performance and large capacity are required for semiconductor packages. As semiconductor packages have been developed to have high performance and high capacity, the power consumption of the semiconductor packages has increased. Consequently, the importance of a structure of semiconductor packages for responding to the size/performance demands of semiconductor packages and stably supplying power to semiconductor packages has increased.

SUMMARY

According to embodiments, there is provided a semiconductor package including a first chip, which includes a first substrate, a first wiring layer on the first substrate, and a plurality of through-electrodes passing through the first substrate to be connected to the first wiring layer and protruding from a lower surface of the first substrate, a double gap-fill layer covering a side surface and a lower surface of the first chip and a protruding portion of the through-electrode and having a double layer structure, a second chip disposed on the first chip and the double gap-fill layer, including a second wiring layer and a second substrate on the second wiring layer, and bonded to the first chip by hybrid bonding (HB), and a bump disposed on a lower surface of the first chip and connected to the through-electrode.

According to embodiments, there is provided a semiconductor package including a first redistribution substrate, an internal package disposed on the first redistribution substrate and including a first chip and a second chip bonded to each other by hybrid bonding and a double gap-fill layer covering a side surface and a lower surface of the first chip, a sealant disposed on the first redistribution substrate and sealing the internal package, a second redistribution substrate disposed on the internal package and the sealant, and a first through-post extending through the sealant around the internal package and connecting the first redistribution substrate to the second redistribution substrate, wherein a first horizontal plane of the first chip is smaller than a second horizontal plane of the second chip, and the double gap-fill layer covers an area corresponding to a difference between the first horizontal plane and the second horizontal plane.

According to embodiments, there is provided a semiconductor package including a first chip including a first substrate, a first wiring layer on the first substrate, and a plurality of through-electrodes passing through the first substrate to be connected to the first wiring layer and protruding from a lower surface of the first substrate, a double gap-fill layer including a lower gap-fill layer covering a lower surface of the first chip and a protruding portion of the through-electrode and an upper gap-fill layer covering a side surface of the first chip, and including an organic-inorganic composite material, a second chip disposed on the first chip and the upper gap-fill layer, including a second wiring layer and a second substrate on the second wiring layer, and bonded to the first chip by hybrid bonding, a redistribution layer disposed on a lower surface of the double gap-fill layer, and a bump disposed on a lower surface of the redistribution layer and connected to the through-electrode through a redistribution line of the redistribution layer, wherein a first horizontal plane of the first chip is smaller than a second horizontal plane of the second chip, and the double gap-fill layer covers an area corresponding to a difference between the first horizontal plane and the second horizontal plane.

According to embodiments, there is provided a method for manufacturing a semiconductor package, including preparing a plurality of first chips each including a first substrate, a first wiring layer on the first substrate, and a plurality of through-electrodes extending from the first wiring layer into the first substrate, preparing a plurality of second chips each including a second substrate having an area larger than an area of the first substrate and a second wiring layer on the second substrate in a wafer state, stacking the first chips on the second chips by hybrid bonding so that the first chips are apart from each other, grinding the first substrate of each of the first chips to thin the first chips, etching the first substrate of each of the first chips so that a portion of the through-electrode protrudes, forming a double gap-fill layer on the second chips to fill a space between the first chips and cover the first chips, forming a redistribution layer on the double gap-fill layer, forming a bump on the redistribution layer, grinding the second substrate of each of the second chips to thin the second chips, and individualizing a resultant structure into a plurality of semiconductor packages each including the first chip, the second chip, and the double gap-fill layer through a sawing process.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
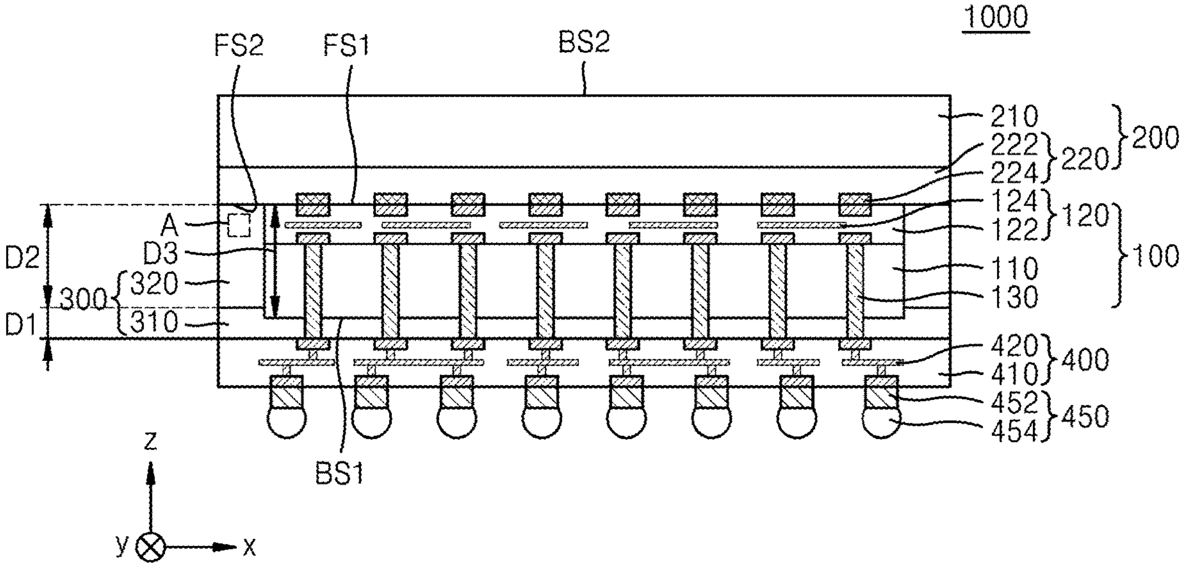
FIGS. 1A and 1B are cross-sectional and enlarged views schematically illustrating a structure of a semiconductor package according to embodiments.

Hereinafter, embodiments are described in detail with reference to the accompanying drawings. Like reference numerals are used for the like components in the drawings, and redundant descriptions thereof are omitted.

Figure 1B:
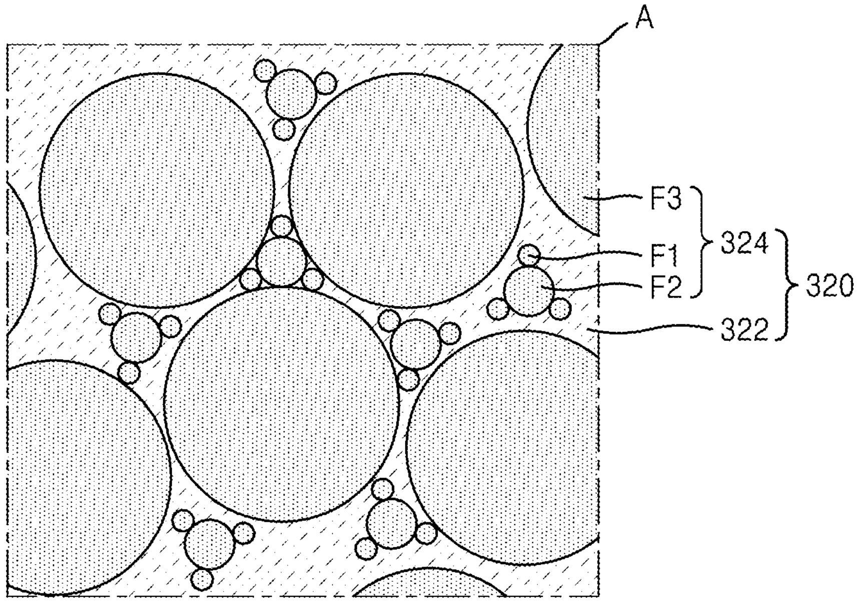

FIGS. 1A and 1B are a cross-sectional view and an enlarged view schematically illustrating a structure of a semiconductor package 1000 according to embodiments, respectively, and FIG. 1B is a partially enlarged view of portion A of FIG. 1A.

Referring to FIGS. 1A and 1B, the semiconductor package 1000 of the present embodiment may include a first chip 100, a second chip 200, a double gap-fill layer 300, and a redistribution layer 400. For example, the first chip 100 may be directly coupled to the second chip 200 through hybrid bonding (HB). Here, hybrid bonding refers to a mixture of pad-to-pad bonding (in which pads of the first chip 100 are directly bonded to pads of the second chip 200) and insulator (In)-to-insulator (In) bonding (in which insulating layers of the first chip 100 are directly bonded to insulating layers of the second chip 100). Meanwhile, because pads generally include copper (Cu), pad-to-pad bonding is also referred to as Cu-to-Cu bonding. For example, in the insulator-to-insulator bonding, the insulating layer may include a nitride film (e.g., $SiN_x$) or an oxide film (e.g., $SiO_2$). In another example, in the semiconductor package 1000 of the present embodiment, the first chip 100 may be bonded to the second chip 200 using anisotropic conductive film (ACF) or bonding using a connection member, e.g., a bump or a solder ball.

The first chip 100 may be an analog chip. For example, the first chip 100 may be a modem chip supporting communication of the second chip 200. In another example, the first chip 100 may include various types of integrated devices supporting an operation of the second chip 200.

The first chip 100 may include a first substrate 110, a first wiring layer 120, and a through-electrode 130. The first substrate 110 constitutes a body of the first chip 100 and may include, e.g., silicon (Si). In another example, the first substrate 110 may include other semiconductor materials, e.g., germanium (Ge) and Si—Ge, or group III-V compounds, e.g., GaP, GaAs, and GaSb. Also, in some embodiments, the first substrate 110 may be a silicon-on-insulator (SOI) substrate or a germanium-on-insulator (GOI) substrate. Meanwhile, the first substrate 110 may include an integrated circuit (IC) layer disposed to be adjacent to the first wiring layer 120. A plurality of integrated elements for performing the operation of the first chip 100 may be disposed on the IC layer.

The first wiring layer 120 may be disposed on the first substrate 110 and may include a wiring insulating layer 122 and wirings 124 in the wiring insulating layer 122. When the wirings 124 are arranged in two or more layers, the wirings 124 of different layers may be connected to each other through a vertical via. Meanwhile, portions of the wirings 124 exposed from upper and/or lower surfaces of the wiring insulating layer 122 may correspond to pads. According to embodiments, the pads may be treated as a component separate from the wirings 124.

The through-electrode 130 may extend through the first substrate 110 in a third direction (e.g., in a Z-direction). Also, as shown in FIG. 1A, the through-electrode 130 may have a structure protruding from the lower surface of the first chip 100, e.g., from the lower surface of the first substrate 110. Meanwhile, because the first substrate 110 includes Si, the through-electrode 130 may correspond to a through silicon via (TSV). For reference, the through-electrode 130 may be classified into a via-first structure formed before the IC layer, a via-middle structure formed before the wiring layer is formed after the formation of the IC layer, and a via-last structure formed after the wiring layer is formed. For example, referring to FIG. 1A, the through-electrode 130 may correspond to the via-middle structure. In another example, the through-electrode 130 may be formed to have the via-first or via-last structure in the semiconductor package 1000 of the present embodiment.

In the first chip 100, referring to FIG. 1A, an upper surface may be a front surface (FS1), which is an active surface, and a lower surface may be a back surface (BS1), which is an inactive surface. In other words, the upper surface of the first wiring layer 120 corresponds to the front surface FS1 of the first chip 100, and the lower surface of the first substrate 110 corresponds to the back surface BS1 of the first chip 100. Meanwhile, a first pad, which is part of the wirings 124 of the first wiring layer 120, may be disposed on the upper surface of the first wiring layer 120, i.e., on the front surface FS1 of the first chip 100.

The second chip 200 may include a plurality of logic devices therein. For example, the logic device may refer to a device including logic circuits, e.g., AND, OR, NOT, and flip-flop, and performing various signal processing. In the semiconductor package 1000 of the present embodiment, the second chip 200 may be, e.g., an application processor (AP) chip. The second chip 200 may also be referred to as a control chip, a process chip, a central processing unit (CPU) chip, or the like depending on a function thereof.

The second chip 200 may include a second substrate 210 and a second wiring layer 220. The second substrate 210 may constitute a body of the second chip 200 and may include, e.g., Si. For example, the second substrate 210 may include an IC layer disposed to be adjacent to the second wiring layer 220. A plurality of integrated devices for performing the operation of the second chip 200 may be disposed in the IC layer.

The second wiring layer 220 may be disposed below the second substrate 210 and may include a wiring insulating layer 222 and wirings 224 in the wiring insulating layer 222. When the wirings 224 are arranged in two or more layers, the wirings 224 in different layers may be connected to each other through a vertical via. Meanwhile, portions of the wirings 224 exposed from the upper and/or lower surfaces of the wiring insulating layers 222 may correspond to pads. In FIG. 1A, for convenience, only the wirings 224 corresponding to pads are shown. According to embodiments, the pad may be treated as a component separate from the wirings 224.

In the second chip 200, a lower surface may be a front surface FS2, which is an active surface, and an upper surface may be a rear surface BS2, which is an inactive surface. In other words, the lower surface of the second wiring layer 220 may correspond to the front surface FS2 of the second chip 200, and the upper surface of the second substrate 210 may correspond to the rear surface BS2 of the second chip 200. Meanwhile, pads of the second chip 200 may be formed on both the front surface FS2 and the rear surface BS2. In other words, a second pad that is part of the wirings 224 of the second wiring layer 220 may be formed on the lower surface of the second wiring layer 220, i.e., on the front surface FS2 of the second chip 200.

As described above, the first chip 100 may be bonded to the second chip 200 by hybrid bonding. Accordingly, the first pad of the first chip 100 may be Cu-to-Cu bonded to the second pad of the second chip 200 corresponding thereto. In addition, the wiring insulating layer 122 of the first wiring layer 120 may be In-to-In bonded to the wiring insulating layer 222 of the second wiring layer 220.

In the semiconductor package 1000 according to the present embodiment, referring to FIG. 1A, the first chip 100 may be disposed below the second chip 200, and the second chip 200 may be disposed above the first chip 100, in a vertical direction, i.e., in a third direction (the Z-direction). Also, an area of the first chip 100 in a horizontal direction may be smaller than that of the second chip 200. Here, the horizontal direction refers to a direction on a plane perpendicular to the third direction, i.e., a plane defined by the first direction (the X-direction) and the second direction (the Y-direction). Accordingly, a non-bonded region not bonded to the first chip 100 may exist in an outer portion of the second chip 200 in the first direction and the second direction, e.g., a portion of the second chip 200 may extend beyond the first chip 100 in the first and second directions and may have a portion of the front surface FS2 not contacting the first chip 100. In the semiconductor package 1000 of the present embodiment, the double gap-fill layer 300 may fill a space corresponding to the non-bonded region of the second chip 200, e.g., the double gap-fill layer 300 may directly contact the portion of the front surface FS2 of the second chip 200 that extends beyond (e.g., overhangs) the first chip 100 in the first and second directions.

The double gap-fill layer 300 may include a lower gap-fill layer 310 and an upper gap-fill layer 320. The lower gap-fill layer 310 may cover the lower surface and part of a side surface of the first chip 100. In addition, the lower gap-fill layer 310 may cover side surfaces of the through-electrode 130 protruding from the lower surface of the first chip 100, e.g., the lower gap-fill layer 310 may cover protruding portions of the through-electrodes 130 extending beyond the lower surface of the first chip 100. A lower surface of the through-electrode 130 may be exposed from a lower surface of the lower gap-fill layer 310, e.g., the lower surfaces of the through-electrode 130 and the lower gap-fill layer 310 may be coplanar.

The lower gap-fill layer 310 may include a material having a high etch rate and high adhesion or adhesion with other material layers. For example, the lower gap-fill layer 310 may include a polymer having a high removal rate (R/R). Here, high R/R, as a rate of removal per unit time, may be a concept including both rates of removal in an etching process and a chemical mechanical polishing (CMP) process. For example, the lower gap-fill layer 310 may include a polymer having an R/R of 5 kÅ/min or greater (i.e., 0.5 μm/min or greater). For example, the lower gap-fill layer 310 may have a first thickness D1 of about 5 μm to 10 μm, e.g., the first thickness D1 may be a maximal thickness of the lower gap-fill layer 310 in the third direction that extends to partially overlap the side surface of the first chip 100.

The lower gap-fill layer 310 may include, e.g., consist essentially of, an organic material. For example, the lower gap-fill layer 310 may include a polymer, e.g., polyimide (PI), polybenzoxazole (PBO), polyhydroxystyrene (PHS), epoxy, or benzocyclobutene (BCB). For example, the lower gap-fill layer 310 may be based on non-photosensitivity and may not include a photosensitizer. In another example, the lower gap-fill layer 310 may include a photosensitive material including a photosensitizer.

The lower gap-fill layer 310 includes a polymer having a high R/R ratio, thereby securing processability in a manufacturing process of the semiconductor package 1000. In addition, by preventing peeling or detaching due to high adhesion of the lower gap-fill layer 310, operating performance and reliability of the semiconductor package 1000 may be improved.

The upper gap-fill layer 320 may cover the side surface of the first chip 100. An upper surface of the upper gap-fill layer 320 may, e.g., directly, contact the second chip 200, e.g., the second wiring layer 220. Also, a lower surface of the upper gap-fill layer 320 may, e.g., directly, contact the lower gap-fill layer 310.

The upper gap-fill layer 320 may include an organic-inorganic composite material. For example, the upper gap-fill layer 320 may include a resin 322 including a filler 324. Here, the resin 322 corresponds to an organic material, and the filler 324 correspond to an inorganic material, e.g., a silica filler, dispersed within the organic material to form the organic-inorganic composite. The upper gap-fill layer 320 may have high filling characteristics. In detail, referring to FIG. 1B, the upper gap-fill layer 320 may have a structure in which the filler 324 may have various sizes included in the resin 322. For example, the filler 324 may include a nano-scale first silica filler F1, a micro-scale third silica filler F3, and an intermediate-scale second silica filler F2. In this manner, the filler 324 have various sizes, so that filling characteristics of the upper gap-fill layer 320 may increase.

Meanwhile, the upper gap-fill layer 320 may include a material having low permittivity. For example, the upper gap-fill layer 320 may include a material having permittivity of about 3.8 or less. The upper gap-fill layer 320 may have a second thickness D2 along the third direction of about 10 μm to about 30 μm, e.g., the second thickness D2 may be larger than the first thickness D1. For reference, a thickness of the first chip 100 may have a third thickness D3 of about 30 μm to about 40 μm, e.g., in the third direction. Also, a total thickness of the lower gap-fill layer 310 and the upper gap-fill layer 320, i.e., a thickness of the double gap-fill layer 300, may be greater than a third thickness D3 of the first chip 100, i.e., D1+D2>D3.

Because the upper gap-fill layer 320 includes an organic-inorganic composite material having a high filling factor, warpage of the semiconductor package 1000 may be effectively controlled. In addition, based on the low permittivity characteristics of the upper gap-fill layer 320, electrical characteristics, e.g., prevention of parasitic capacitors and minimization of RC delay, may be improved in the semiconductor package 1000.

The redistribution layer 400 may be disposed on the lower surface of the double gap-fill layer 300, e.g., the lower gap-fill layer 310 may be between the first chip 100 and the redistribution layer 400. The redistribution layer 400 may include a redistribution insulating layer 410 and redistribution lines 420 in the redistribution insulating layer 410. The redistribution insulating layer 410 may include, e.g., photo imageable dielectric (PID) resin and may further include an inorganic filler. When the redistribution lines 420 are disposed in two or more layers, the redistribution lines 420 in different layers may be connected to each other through a vertical via.

Meanwhile, portions of the redistribution lines 420 exposed from upper and/or lower surfaces of the redistribution insulating layer 410 may correspond to pads. An upper pad which is part of the redistribution lines 420 exposed from the upper surface of the redistribution insulating layer 410 may be connected to the through-electrode 130. In addition, a lower pad which is part of the redistribution lines 420 exposed from the lower surface of the redistribution insulating layer 410 may be connected to bumps 450. According to embodiments, the upper pad and the lower pad may be treated as components separate from the redistribution lines 420.

The bump 450 may be disposed on a lower surface of the redistribution layer 400. The bump 450 may connect the semiconductor package 1000 to another substrate, e.g., a first redistribution substrate (refer to 620 of FIG. 3A). For example, the bump 450 may include a pillar 452 and a solder 454. In another example, the bump 450 may include only the solder 454.

In the semiconductor package 1000 of the present embodiment, the first chip 100 may be bonded to the second chip 200 by hybrid bonding (e.g., the first and second chips 100 and 200 may be hybrid bonded to each other), and the upper second chip 200 may be larger than the lower first chip 100, e.g., the upper second chip 200 may extend horizontally beyond the lower first chip 100 in both the first and second directions to have a larger area, in a top view, than an area of the lower first chip 100, forming a large-top structure. In addition, the first chip 100 is surrounded by the double gap-fill layer 300 directly contacting the lateral sidewall of the lower first chip 100 and the extending portion of the upper second chip 200 (e.g., so the double gap-fill layer 300 covers an area (e.g., a gap) corresponding to a difference between the area of the first horizontal plane of the first chip 100 and the area of the second horizontal plane of the second chip 200). The double gap-fill layer 300 may include a lower gap-fill layer 310 and an upper gap-fill layer 320. The lower gap-fill layer 310 may include a polymer having a high R/R and high adhesion, thereby securing processability of the semiconductor package 1000 and contributing to improvement in operating performance and reliability. In addition, the upper-gap-fill layer 320 may include an organic-inorganic composite material having a high filling factor and a low permittivity, thereby contributing to controlling warpage and improving electrical characteristics of the semiconductor package 1000.

Figure 2A:
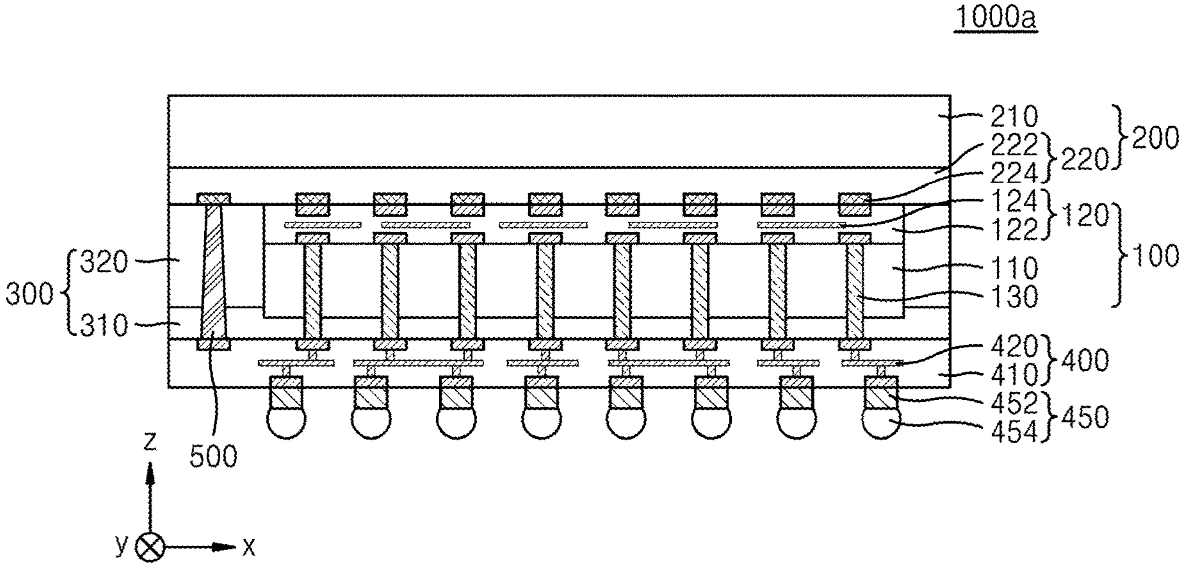
FIGS. 2A and 2B are cross-sectional views schematically illustrating structures of semiconductor packages, respectively, according to embodiments.
Figure 2B:
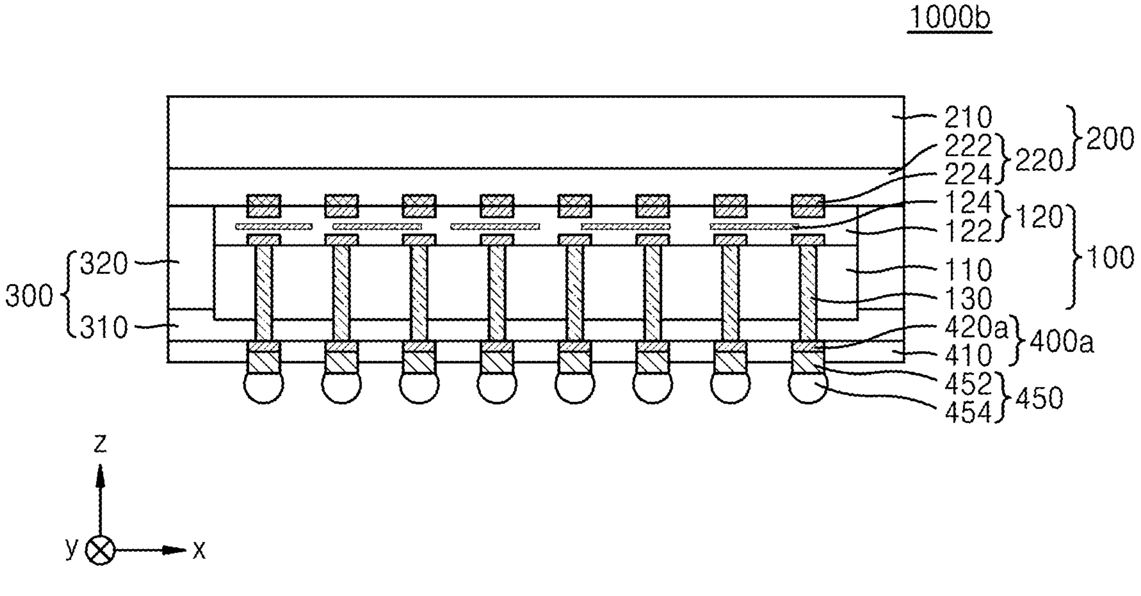

FIGS. 2A and 2B are cross-sectional views schematically illustrating structures of semiconductor packages 1000*a* and 1000*b*, respectively, according to embodiments. The description already given above with reference to FIGS. 1A and 1B is only briefly given or omitted.

Referring to FIG. 2A, the semiconductor package 1000*a* of the present embodiment may be different from the semiconductor package 1000 of FIG. 1A in that a through-post 500 may be further included. In detail, the semiconductor package 1000*a* according to the present embodiment may include the first chip 100, the second chip 200, the double gap-fill layer 300, the redistribution layer 400, and the through-post 500. The first chip 100, the second chip 200, the double gap-fill layer 300, and the redistribution layer 400 are the same as those of the semiconductor package 1000 described above with reference to FIG. 1A. However, due to the presence of the through-post 500, the first chip 100 may be slightly off-centered from the second chip 200 in a horizontal direction, rather than being centered on the second chip.

The through-post 500 may have a structure extending in the third direction (the z direction) through the double gap-fill layer 300. The through-post 500 may be formed by forming a through-hole in the double gap-fill layer 300 and filling the through-hole with a metal material. The through-post 500 may electrically connect the redistribution layer 400 to the second wiring layer 220.

In the semiconductor package 1000*a* of the present embodiment, the through-posts 500 may be adjacent to one side of the first chip 100 and arranged in plurality in a row in the second direction (the y direction). Also, in other embodiments, the through-posts 500 may be disposed in two or more rows in the second direction (the y direction). Furthermore, the through-post 500 may be arranged to be adjacent to each of both sides of the first chip 100 in at least one row. When the through-posts 500 are arranged on both sides of the first chip 100, the first chip 100 may be disposed in the center of the second chip 200 in a horizontal direction. Meanwhile, because the through-post 500 passes through the double gap-fill layer 300 that is a dielectric layer, the through-post 500 may correspond to a through dielectric via (TDV).

Referring to FIG. 2B, a semiconductor package 1000*b* of the present embodiment may be different from the semiconductor package 1000 of FIG. 1A in the structure of a redistribution layer 400*a*. In detail, the semiconductor package 1000*b* of the present embodiment may include the first chip 100, the second chip 200, the double gap-fill layer 300, and the redistribution layer 400*a*. The first chip 100, the second chip 200, and the double gap-fill layer 300 are the same as those of the semiconductor package 1000 described above with reference to FIG. 1A.

The redistribution layer 400*a* may include a redistribution insulating layer 410 and redistribution lines 420*a*. The redistribution lines 420*a* may include only pads arranged in a single layer structure. For example, upper surfaces of the redistribution lines 420*a* may be connected to the through-electrode 130. Also, lower surfaces of the redistribution lines 420*a* may be exposed to a lower surface of the redistribution insulating layer 410, and the bumps 450 may be disposed on the lower surfaces of the redistribution lines 420*a*.

Figure 3A:
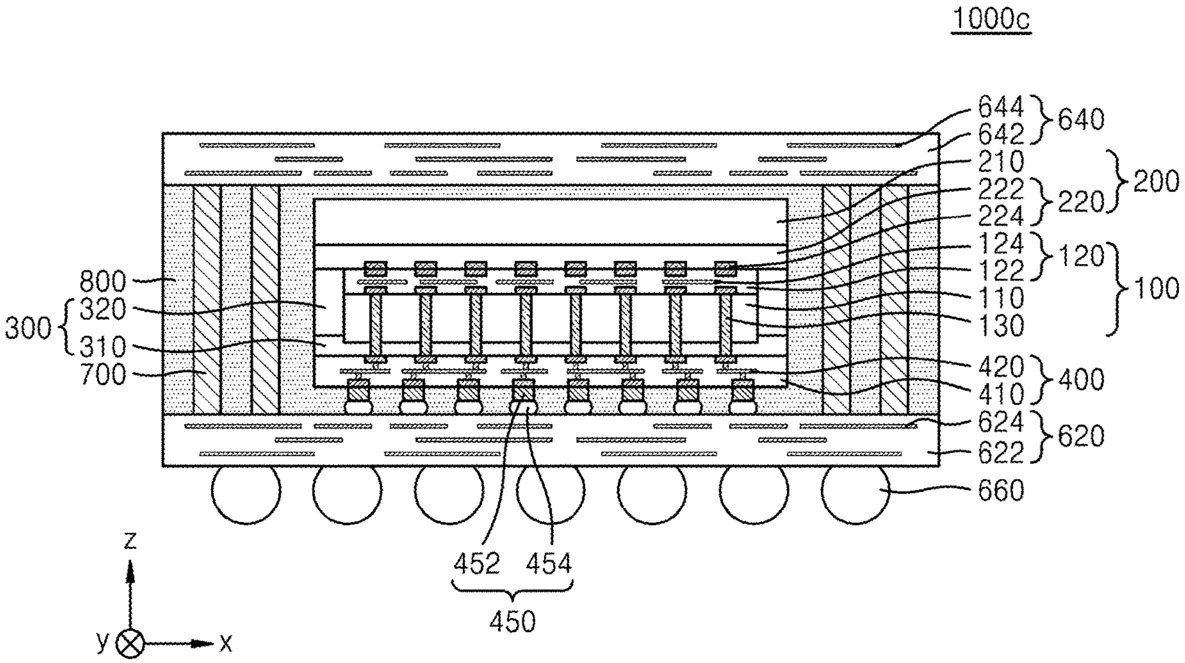
FIGS. 3A and 3B are cross-sectional views schematically illustrating structures of semiconductor packages, respectively, according to embodiments.
Figure 3B:
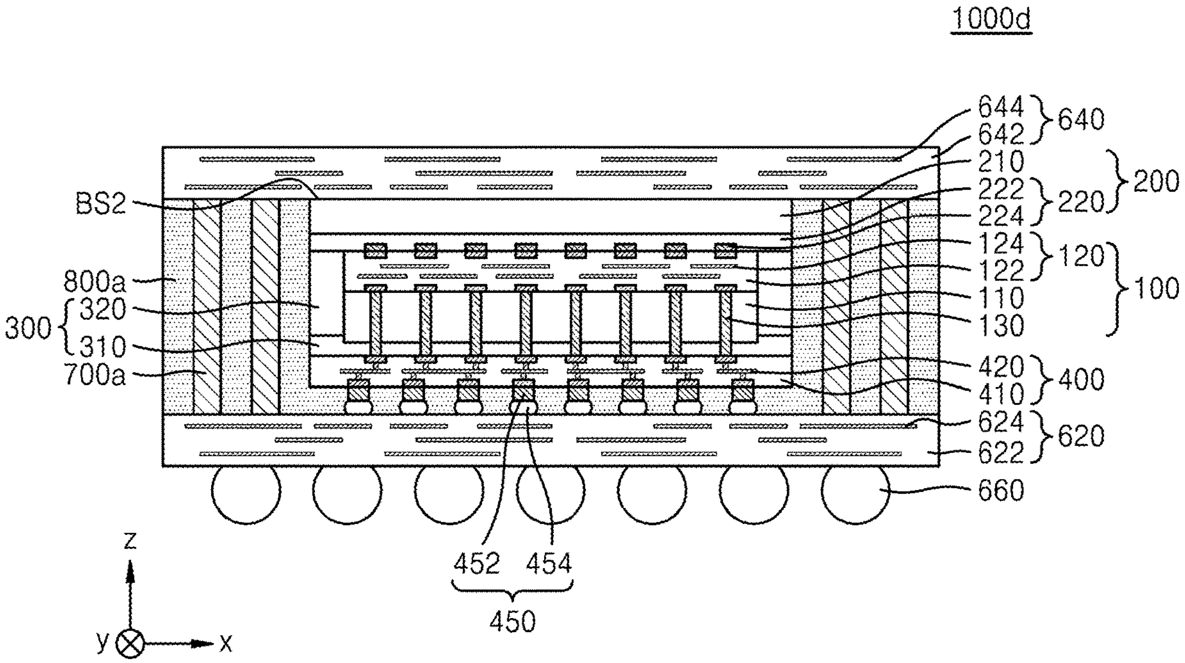

FIGS. 3A and 3B are cross-sectional views schematically illustrating structures of semiconductor packages 1000*c* and 1000*d* according to embodiments. The description already given above with reference to FIGS. 1A to 2B is only briefly given or omitted.

Referring to FIG. 3A, the semiconductor package 1000*c* of the present embodiment may include the first chip 100, the second chip 200, the double gap-fill layer 300, the redistribution layer 400, a first redistribution substrate 620, a second redistribution substrate 640, a through-post 700, a sealant 800, and an external connection terminal 660. The first chip 100, the second chip 200, the double gap-fill layer 300, and the redistribution layer 400 are the same as those of the semiconductor package 1000 described above with reference to FIG. 1A.

The first redistribution substrate 620 may be disposed below the redistribution layer 400. The first redistribution substrate 620 may include a first body insulating layer 622 and first redistribution lines 624 in the first body insulating layer 622. The first body insulating layer 622 may include an insulating material, e.g., a PID resin, and may further include an inorganic filler. When the first redistribution lines 624 are disposed in two or more layers, the first redistribution lines 624 in different layers may be connected to each other through a vertical via. For example, portions of the first redistribution lines 624 exposed from the upper and/or lower surfaces of the first body insulating layer 622 may correspond to pads.

The external connection terminal 660 may be disposed on a lower surface of the first body insulating layer 622. The external connection terminal 660 may be disposed on an external connection pad that is part of the first redistribution lines 624 exposed from the lower surface of the first body insulating layer 622. The external connection terminal 660 may be electrically connected to the redistribution layer 400 through the first redistribution lines 624 of the first redistribution substrate 620 and the bump 450.

The through-post 700 may be disposed between the first redistribution substrate 620 and the second redistribution substrate 640. As the sealant 800 is disposed between the first redistribution substrate 620 and the second redistribution substrate 640, the through-post 700 may extend through the sealant 800 in the third direction (the z direction). The through-post 700 may electrically connect the first redistribution substrate 620 to the second redistribution substrate 640. For example, a lower surface of the through-post 700 may be connected to the first redistribution lines 624 of the first redistribution substrate 620, and an upper surface of the through-post 700 may be connected to the second redistribution lines 644 of the second redistribution substrate 640.

The through-post 700 may include, e.g., Cu. The through-post 700 may be formed through electroplating using a seed metal (refer to 710*a* in FIG. 6F). Accordingly, the seed metal 710*a* may be formed on the first redistribution substrate 620, and the through-post 700 may be formed on the seed metal 710*a*. The seed metal 710*a* may include, e.g., Cu. Accordingly, in the semiconductor package 1000*c* of the present embodiment, the seed metal 710*a* may be included as a portion of the through-post 700, and in FIG. 3A, the seed metal 710*a* is not separately indicated.

The sealant 800 may be disposed between the first redistribution substrate 620 and the second redistribution substrate 640. The sealant 800 may cover and seal the second chip 200, the double gap-fill layer 300, and the redistribution layer 400. In addition, the sealant 800 may surround a side surface of the through-post 700. Meanwhile, as shown in FIG. 3A, the sealant 800 may fill a space between the first redistribution substrate 620 and the redistribution layer 400 and a space between the bumps 450 on the lower surface of the redistribution layer 400. However, in some embodiments, an underfill may be provided between the bumps 450 and the sealant 800 may cover the underfill.

For example, the sealant 800 may include an insulating material, e.g., a thermosetting resin (e.g., an epoxy resin), a thermoplastic resin (e.g., polyimide), or a resin obtained by including a reinforcing material (e.g., an inorganic filler) in the thermosetting resin or the thermoplastic resin, e.g., ABF, FR-4, or a BT resin. In addition, the sealant 800 may include a molding material, e.g., EMC, or a photosensitive material, e.g., PID.

The second redistribution substrate 640 may be disposed on the through-post 700 and the sealant 800. The second redistribution substrate 640 may have a structure similar to that of the first redistribution substrate 620. For example, the second redistribution substrate 640 may include a second body insulating layer 642 and second redistribution lines 644. The second body insulating layer 642 and the second redistribution lines 644 are the same as the first body insulating layer 622 and the first redistribution lines 624 of the first redistribution substrate 620 described above. The second redistribution lines 644 of the second redistribution substrate 640 may be electrically connected to the bump 450 and the external connection terminal 660 through the through-post 700 and the first redistribution lines 624 of the first redistribution substrate 620.

The external connection terminal 660 may be disposed on the external connection pad on the lower surface of the first redistribution substrate 620 and may be electrically connected to the first redistribution lines 624 through the external connection pad. The external connection terminal 660 may connect the semiconductor package 1000*c* to a package substrate of an external system or a main board of an electronic device, e.g., a mobile device. The external connection terminal 660 may include a conductive material, e.g., at least one of solder, tin (Sn), silver (Ag), copper (Cu), and aluminum (Al).

Meanwhile, an upper package (refer to 900 in FIG. 4A) including a memory chip may be stacked on an upper surface of the second redistribution substrate 640 through an inter-substrate connection terminal (refer to 950 in FIG. 4A), e.g., the upper package may be electrically connected to the second redistribution substrate through an inter-substrate connection terminal. A structure of an entire semiconductor package in which the upper package is stacked on the second redistribution substrate 640 may correspond to a package-on-package (POP) structure. Meanwhile, at least one semiconductor chip (refer to 910*a* in FIG. 4B) and/or at least one passive element (refer to 940 in FIG. 4B) may be directly stacked on the upper surface of the second redistribution substrate 640.

Referring to FIG. 3B, the semiconductor package 1000*d* of the present embodiment may be different from the semiconductor package 1000*c* of FIG. 3A in that the second chip 200 is disposed in direct contact with the second redistribution substrate 640. In detail, in the semiconductor package 1000*d* of the present embodiment, the rear surface BS2 of the second chip 200 may be in direct contact with the lower surface of the second redistribution substrate 640. In other words, the sealant 800 may not be located between the second chip 200 and the second redistribution substrate 640.

In the semiconductor package 1000*d* of the present embodiment, because the second chip 200 is disposed to be in direct contact with the second redistribution substrate 640, a thickness of a sealant 800*a* may be reduced and a length of the through-post 700 may be shortened. Accordingly, the thickness of the entire semiconductor package 1000*d* may be reduced. Meanwhile, in a semiconductor package structure in which the second chip 200 is in direct contact with the second redistribution substrate 640, the through-post 700 may have a double metal layer structure according to embodiments. For example, the through-post 700 may have a double metal layer structure including a lower metal layer of Cu and an upper metal layer of nickel (Ni). As such, because the through-post 700 includes the upper metal layer of Ni thereon, contamination by the through-post 700 of Cu during a grinding process of an upper portion of the sealant 800 may be minimized.

Figure 4A:
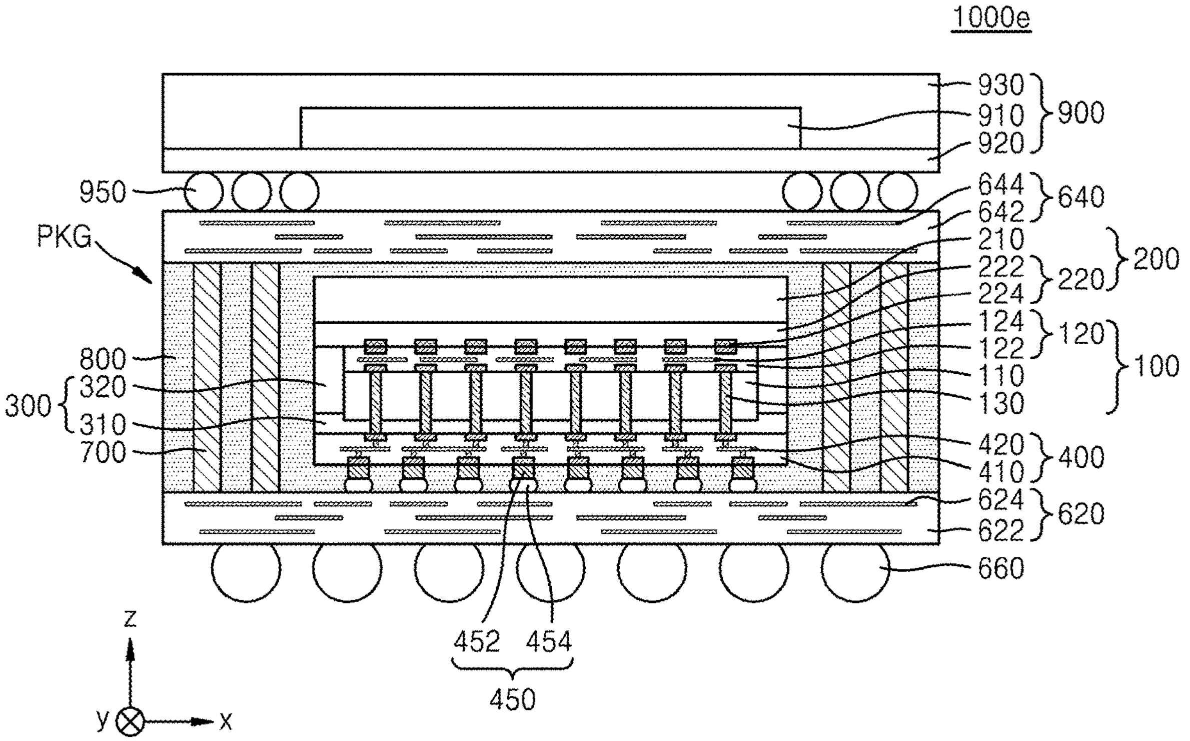
FIGS. 4A and 4B are cross-sectional views schematically illustrating structures of semiconductor packages, respectively, according to embodiments.
Figure 4B:
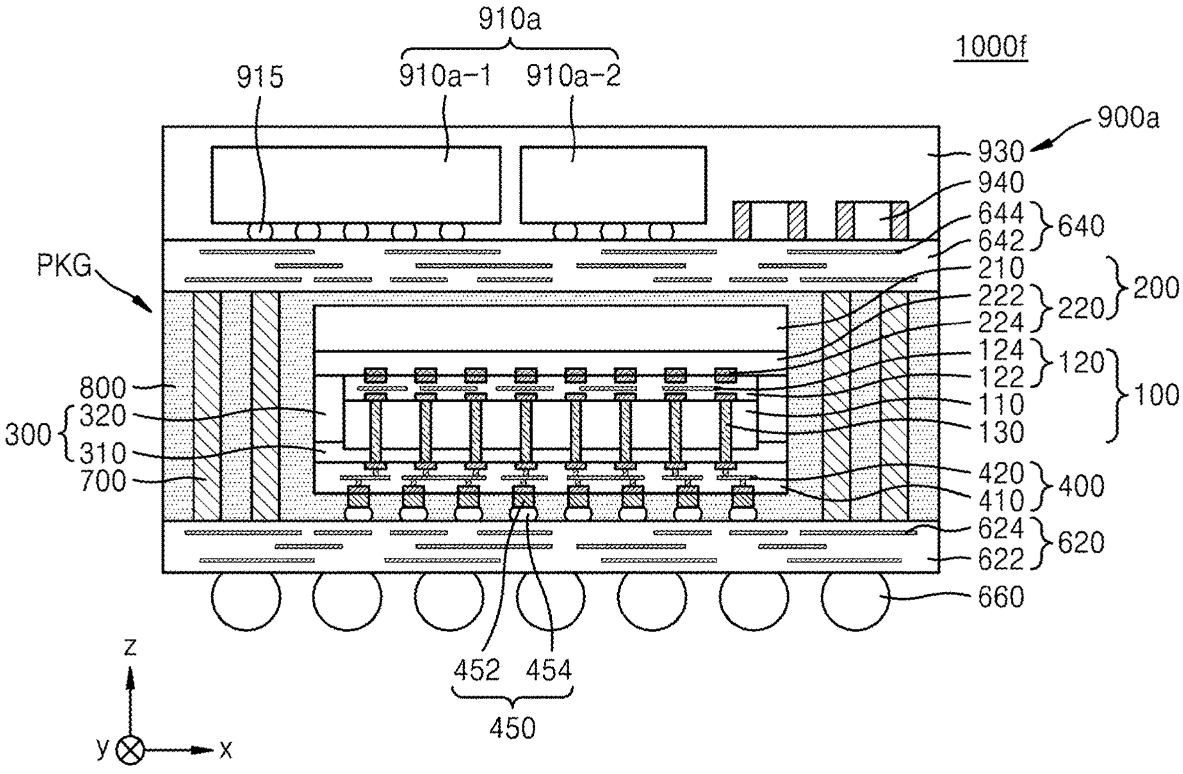

FIGS. 4A and 4B are cross-sectional views schematically illustrating structures of semiconductor packages 1000*e* and 1000*f* according to embodiments. The description already given above with reference to FIGS. 1A to 3B is only briefly given or omitted.

Referring to FIG. 4A, the semiconductor package 1000*e* of the present embodiment may be different from the semiconductor package 1000*c* of FIG. 3A in that an upper package 900 may be further included. In detail, the semiconductor package 1000*e* of the present embodiment may include a lower package PKG and the upper package 900. For example, the lower package PKG may be the semiconductor package 1000*c* of FIG. 3A or the semiconductor package 1000*d* of FIG. 3B.

The upper package 900 may include a third chip 910, an upper package substrate 920, and an upper sealant 930. For example, the third chip 910 may include a volatile memory device, e.g., dynamic random access memory (DRAM) or static random access memory (SRAM) or a non-volatile memory device, e.g., a flash memory. In FIG. 4A, the third chip 910 having a single chip structure is stacked on the upper package substrate 920, but a multi-stack chip structure, instead of the single chip structure, may be stacked on the upper package substrate 920. For example, the multi-stack chip structure may be mounted on the upper package substrate 920 through bonding wires or may be mounted on the upper package substrate 920 using bumps and TSVs.

The upper package substrate 920 may be formed based on, e.g., a ceramic substrate, a printed circuit board (PCB), an organic substrate, or an interposer substrate. In the semiconductor package 1000*e* of the present embodiment, the upper package substrate 920 may be a PCB. The inter-substrate connection terminal 950, e.g., bumps or solder balls, may be disposed on a lower surface of the upper package substrate 920. The upper package 900 may be stacked on the second redistribution substrate 640 through the inter-substrate connection terminal 950.

The upper sealant 930 may seal the third chip 910 and protect the third chip 910 from external physical or chemical damage. Meanwhile, when the third chip 910 is stacked on the upper package substrate 920 through bumps, the upper sealant 930 may fill a space between the third chip 910 and the upper package substrate 920 and between the bumps.

Referring to FIG. 4B, the semiconductor package 1000*f* of the present embodiment may be different from the semiconductor package 1000*e* of FIG. 4A in the structure of an upper package 900*a*. In detail, the semiconductor package 1000*f* of the present embodiment may include the lower package PKG and the upper package 900*a*. The lower package PKG may be the semiconductor package 1000*c* of FIG. 3A or the semiconductor package 1000*d* of FIG. 3B.

The upper package 900*a* may include at least one third chip 910*a*, at least one passive element 940, and an upper sealant 930. The third chip 910*a* may be a memory chip. The third chip 910*a* may include, e.g., a volatile memory device, a non-volatile memory device, a logic chip, etc.

For example, as shown in FIG. 4B, the upper package 900*a* may include two third chips 910*a*-1 and 910*a*-2. The two third chips 910*a*-1 and 910*a*-2 may be the same types of semiconductor chips or different types of semiconductor chips. In another example, the upper package 900*a* may include one or three or more third chips 910*a*. Meanwhile, at least one of the two third chips 910*a*-1 and 910*a*-2 may have a multi-stack chip structure. The third chip 910*a* may be directly mounted on the second redistribution substrate 640 through the bump 915. Meanwhile, the third chip 910*a* may be mounted on the second redistribution substrate 640 through a bonding wire, instead of the bump 915.

The passive element 940 may include two-terminal elements, e.g., resistors, capacitors, and inductors. For example, as illustrated in FIG. 4B, two passive elements 940 may be disposed on the second redistribution substrate 640. The upper sealant 930 may seal the third chip 910*a* and the passive element 940 to protect the third chip 910*a* and the passive element 940 from external physical and chemical damage.

FIGS. 5A to 5J are cross-sectional views schematically illustrating stages in a process of manufacturing the semiconductor package 1000 of FIG. 1A. The descriptions already given above with reference to FIGS. 1A to 4B are only briefly given or omitted.

Figure 5A:
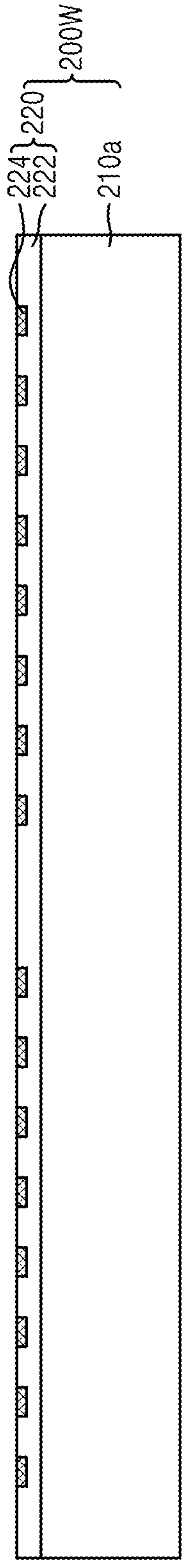
FIGS. 5A to 5J are cross-sectional views schematically illustrating stages in a process of manufacturing the semiconductor package of FIG. 1A.

Referring to FIG. 5A, in the method for manufacturing the semiconductor package 1000 of the present embodiment, first, a wafer 200W including a plurality of second chips is prepared. Each of the second chips may include a second substrate 210*a* and a second wiring layer 220. The second wiring layer 220 may include a wiring insulating layer 222 and wirings 224. Meanwhile, the wirings 224 may include pads. Accordingly, preparing the wafer 200W may include forming the wirings 224 in each of the second chips. Also, forming the wirings 224 may include forming pads on the wiring insulating layer 222.

Meanwhile, along with the preparation of the wafer 200W, a plurality of first chips (refer to 100*a* in FIG. 5B) are prepared together or before and after the preparation of the wafer 200W, e.g., the plurality of first chips may be spaced apart from each other. The first chips 100*a* may be prepared in an individualized state after a sawing process, not in a wafer state.

Figure 5B:
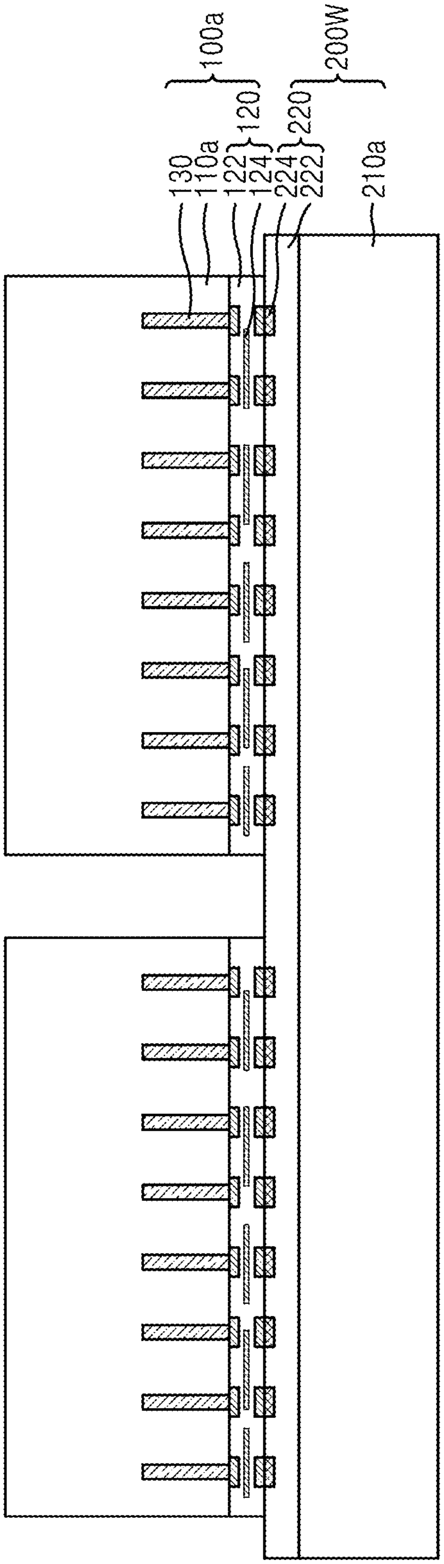

Referring to FIG. 5B, the first chips 100*a* are stacked on the second chips by hybrid bonding. Meanwhile, when stacking by hybrid bonding, an annealing process may be performed. Each of the first chips 100*a* may include a first substrate 110*a*, a first wiring layer 120, and a through-electrode 130. Meanwhile, as shown in FIG. 5B, the through-electrode 130 may have a structure that penetrates a portion of the first substrate 110*a*, rather than the entire first substrate 110*a*.

Figure 5C:
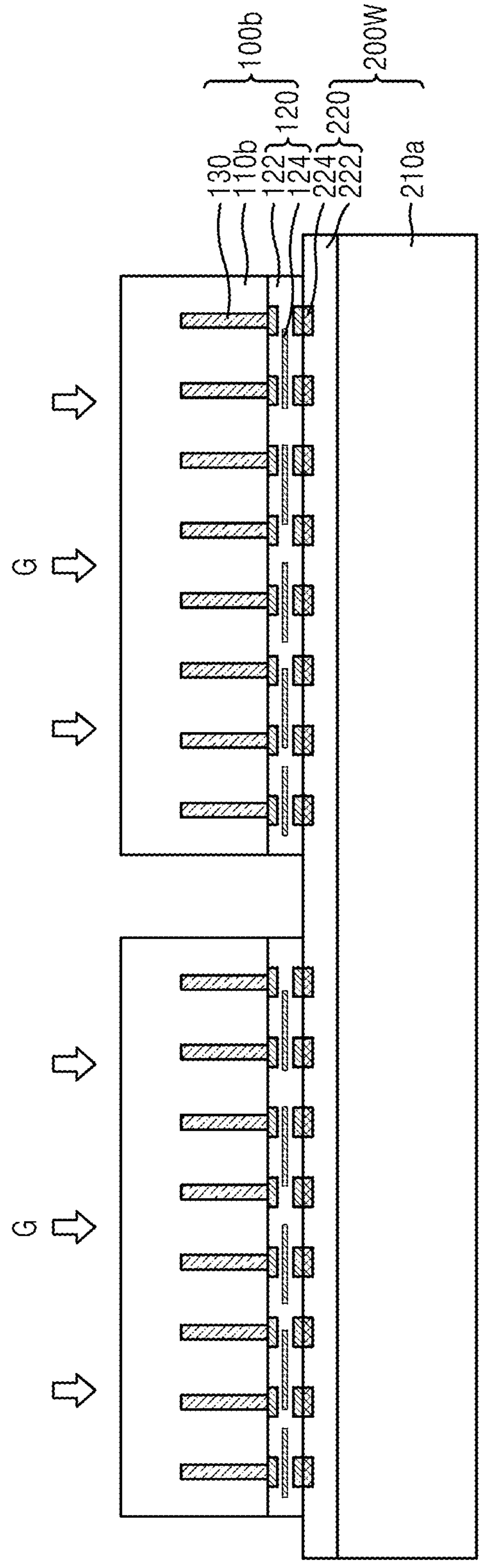

Referring to FIG. 5C, after the first chips 100*a* are stacked, the rear surfaces of the first chips 100*a* are removed through a grinding process G to thin the first chips 100*a*. However, in the thinned first chips 100*b*, the through-electrode 130 may not yet be exposed from the first substrate 110*b*.

Figure 5D:
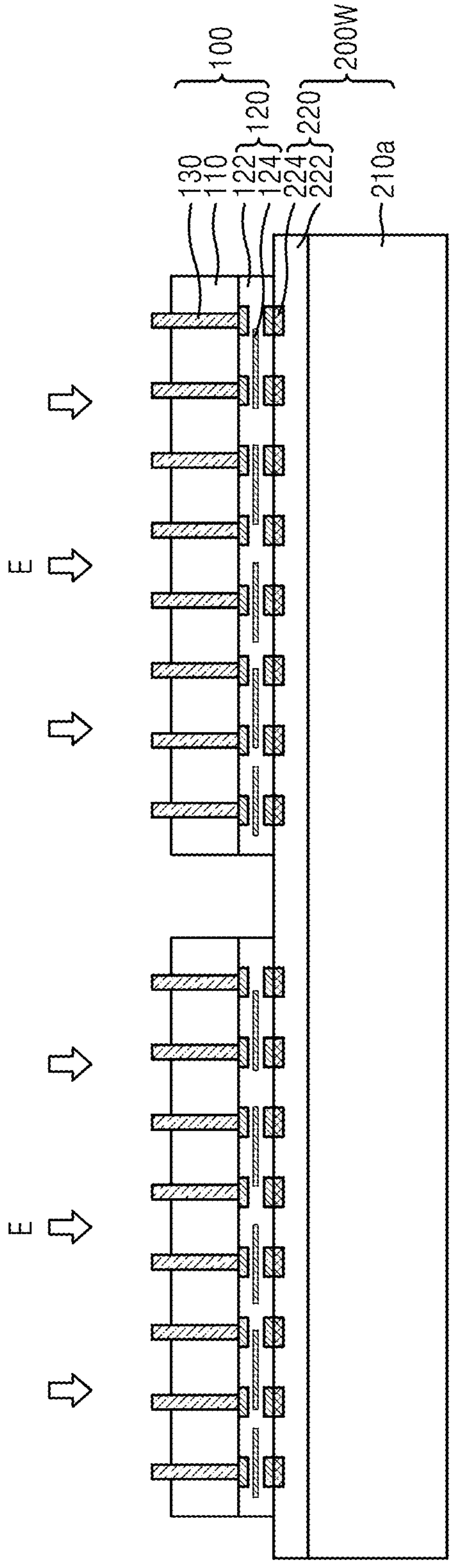

Referring to FIG. 5D, the rear surface of the first chips 100*a* may be subsequently removed through an etching process E so that the through-electrode 130 protrudes from the rear surface of the first substrate 110. Here, the etching process E may include a wet etching process for the first substrate 110 of Si. Each of the thinned first chips 100 may correspond to the first chip 100 of the semiconductor package 1000 of FIG. 1A.

Figure 5E:
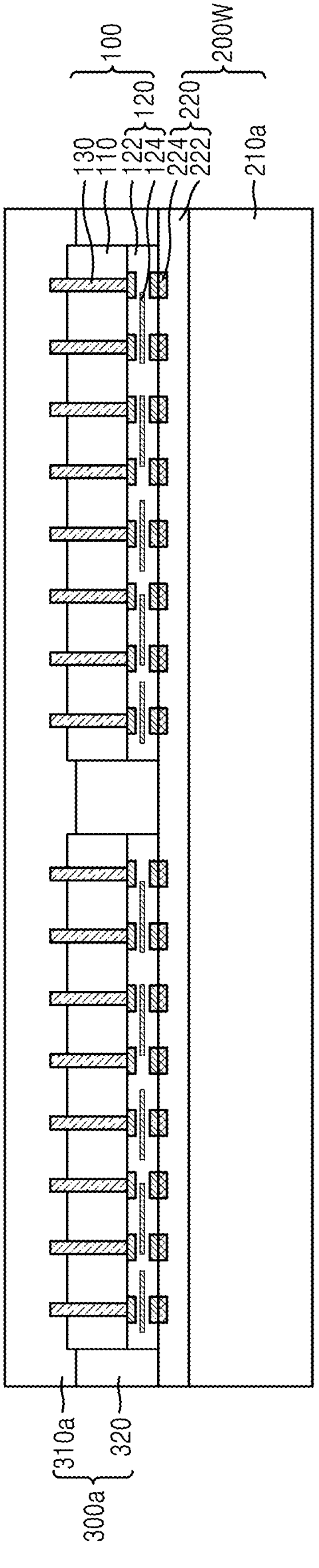

Referring to FIG. 5E, thereafter, a double gap-fill layer 300*a* is applied on the wafer 200W to cover the side, e.g., lateral, surfaces and upper surfaces of the first chips 100. The double gap-fill layer 300*a* is formed to be thick to cover the (protruding) upper surface of the through-electrode 130.

In detail, first, the gap-fill layer 320 is applied to fill a space between the first chips 100. As described above, the upper gap-fill layer 320 may include silica fillers having various sizes in a resin to have high filling characteristics.

After filling the upper gap-fill layer 320, a lower gap-fill layer 310*a* is applied on the upper gap-fill layer 320. The lower gap-fill layer 310*a* may include a polymer having high R/R and high adhesion. Accordingly, the lower gap-fill layer 310*a* may be firmly attached to the upper gap-fill layer 320 and the first chips 100.

For reference, in the upper gap-fill layer 320 and the lower gap-fill layer 310*a*, the terms of upper and lower are based on the structure of the final semiconductor package 1000, and may be opposite at this stage. That is, in FIG. 5E, the upper gap-fill layer 320 may be located on a lower side and the lower gap-fill layer 310*a* may be located on an upper side.

Figure 5F:
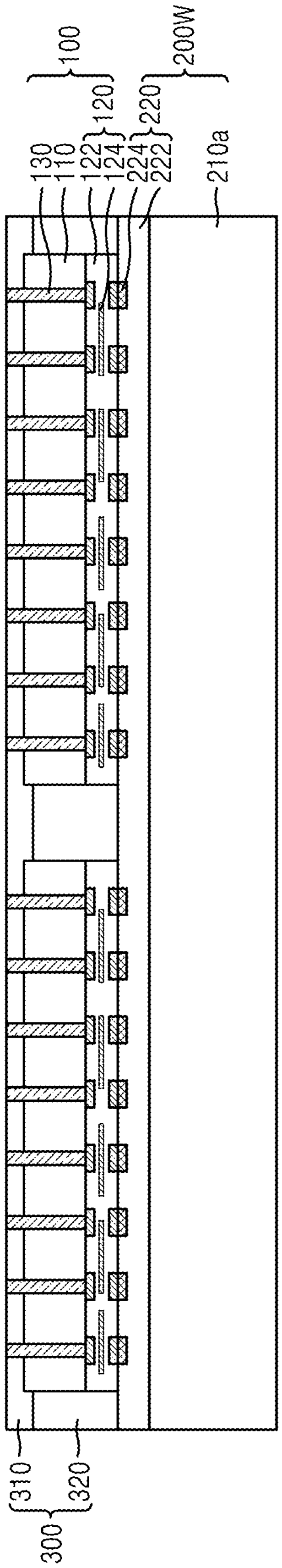

Referring to FIG. 5F, an upper portion of the double gap-fill layer 300*a* is removed through a CMP process. For example, the upper portion of the lower gap-fill layer 310*a* is removed through the CMP process. The CMP process may be performed using the through-electrode 130 as an etch stop layer. Therefore, after the CMP process, the upper surface of the through-electrode 130 may be exposed from the upper surface of the lower gap-fill layer 310*a*.

Figure 5G:
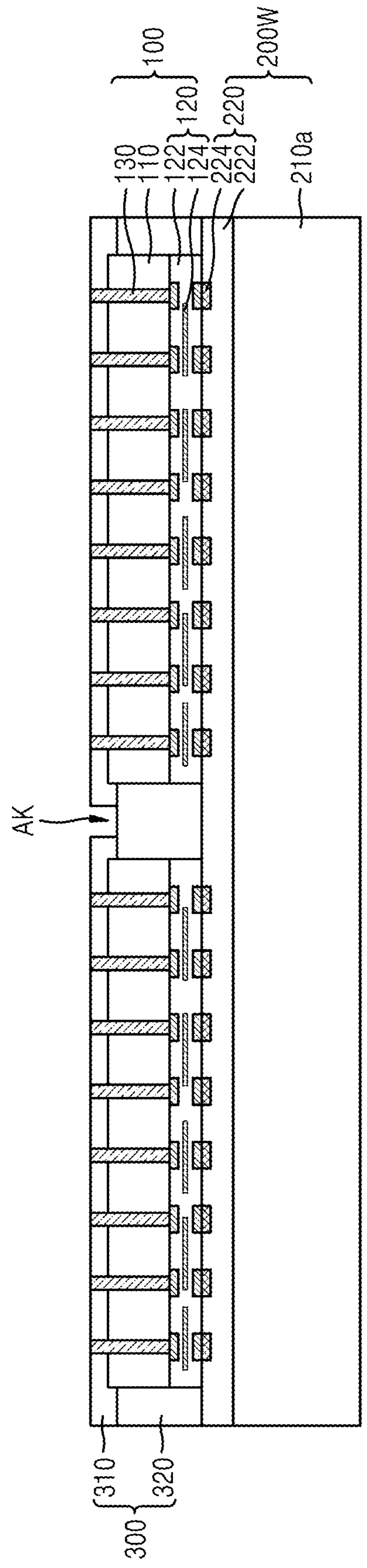

Referring to FIG. 5G, an align key AK is then formed between the first chips 100. The align key AK may be formed to align patterns on the first chips 100 in a subsequent process.

Figure 5H:
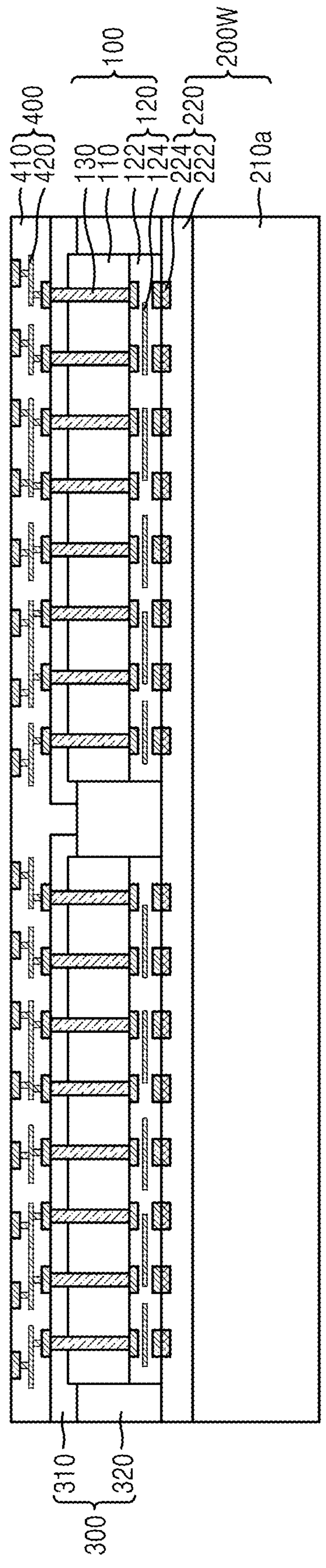

Referring to FIG. 5H, the redistribution layer 400 is subsequently formed on the double gap-fill layer 300. The redistribution layer 400 may include the redistribution insulating layer 410 and the redistribution lines 420. The redistribution lines 420 on the lower surface of the redistribution insulating layer 410, i.e., the upper pad, may be connected to the through-electrode 130. Meanwhile, the redistribution lines 420 on the upper surface of the redistribution insulating layer 410, i.e., the lower pad, may be exposed from the redistribution insulating layer 410. In the upper pad and lower pad, the terms upper and lower may also be based on a final structure, e.g., orientation, of the semiconductor package 1000.

Figure 5I:
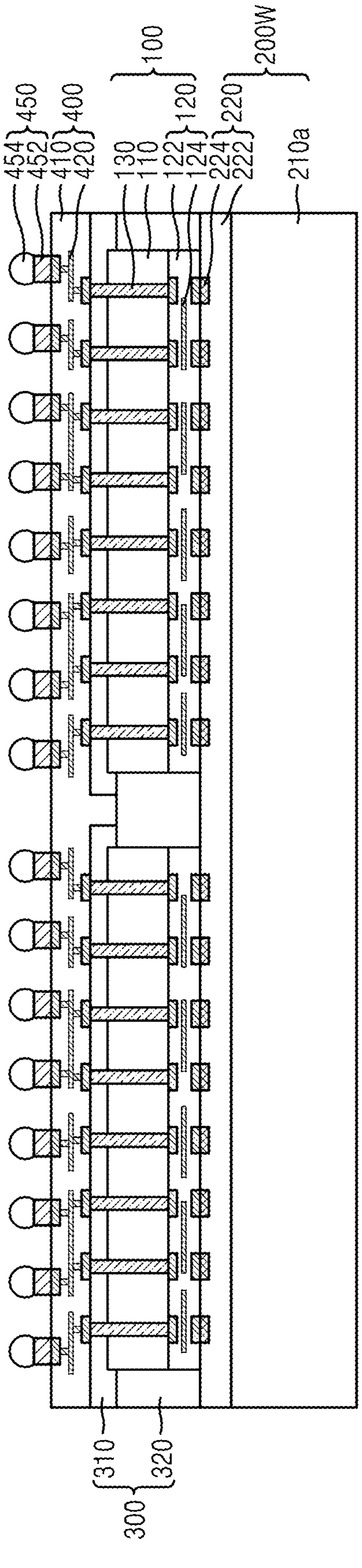

Referring to FIG. 5I, after forming the redistribution layer 400, the bump 450 is formed on the lower pad that is part of the redistribution lines 420 of the redistribution layer 400. The bump 450 may include, e.g., the pillar 452 and the solder 454.

Figure 5J:
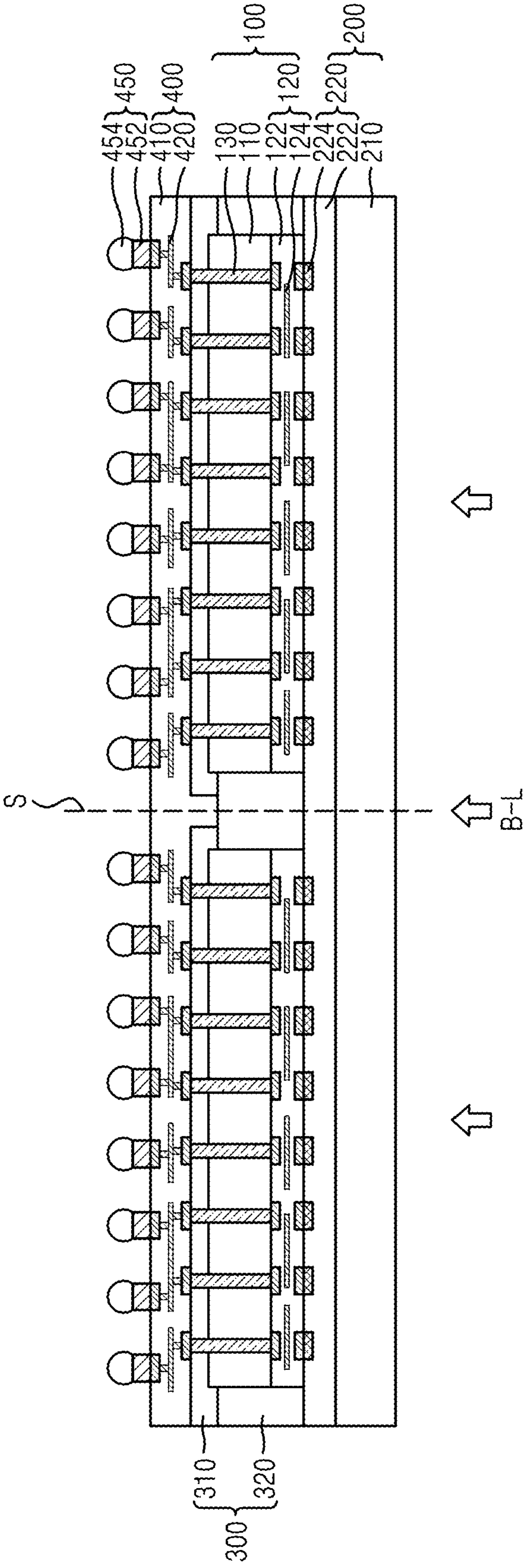

Referring to FIG. 5J, thereafter, a back-lap process B-L of grinding the rear surface of the wafer 200W is performed to thin the wafer 200W. Thereafter, the wafer 200W and structures on the wafer 200W are individualized through a sawing process S. Here, each of the structures may include the first chip 100, the double gap-fill layer 300, the redistribution layer 400, and the bump 450. After the sawing process S, each of the plurality of second chips and a structure corresponding thereto may correspond to the semiconductor package 1000 of FIG. 1A.

Meanwhile, in the process of FIG. 5H, when the redistribution layer 400*a* is formed to include only the redistribution insulating layer 410 and single-layered pads, the semiconductor package 1000*b* of FIG. 2B may be manufactured through the process of FIGS. 51 and 5J.

Figure 6A:
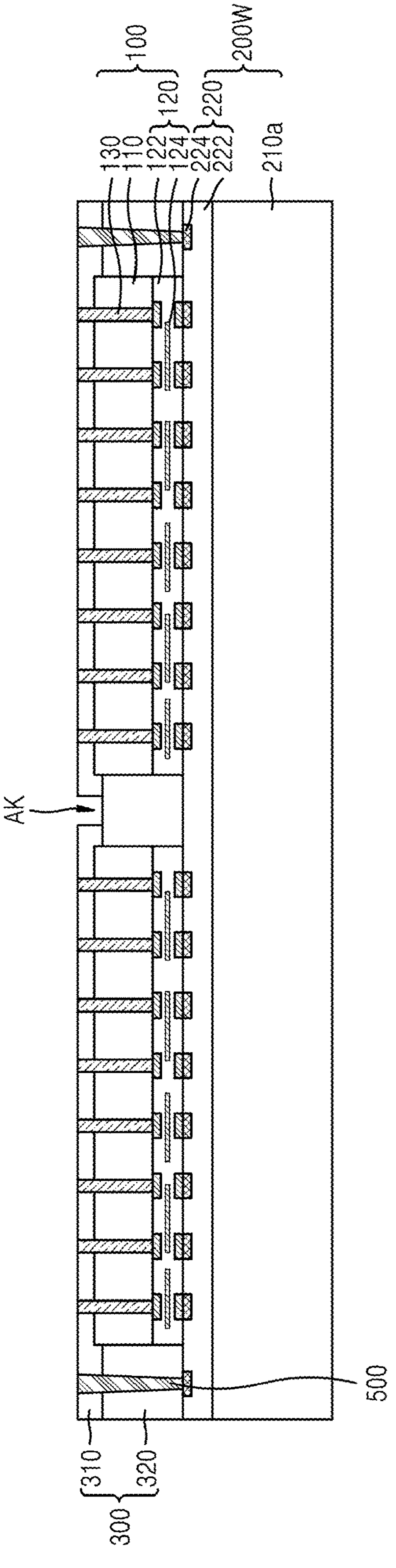
FIGS. 6A and 6D are cross-sectional views schematically illustrating stages in a process of manufacturing the semiconductor package of FIG. 2A.
Figure 6B:
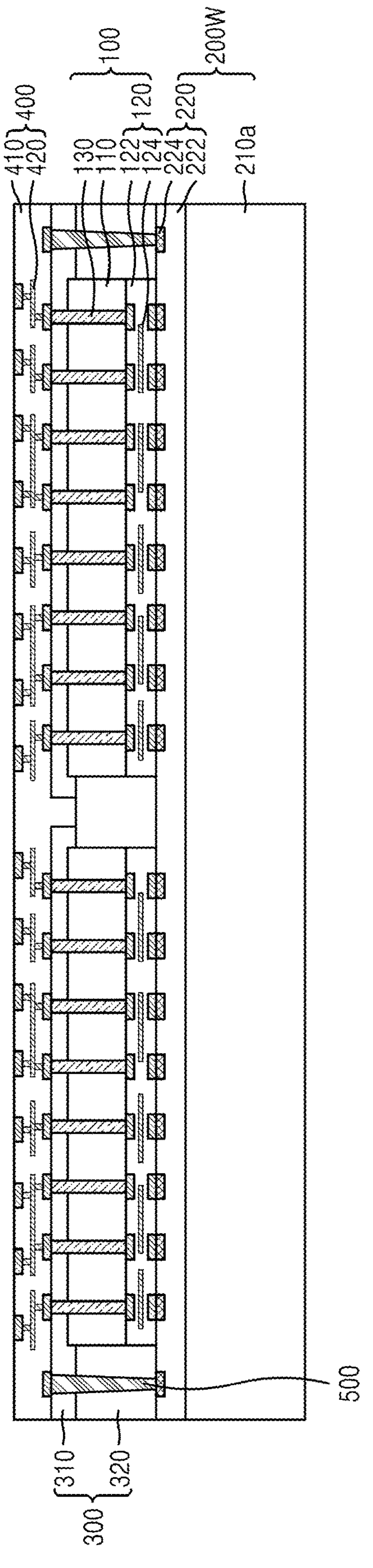
Figure 6C:
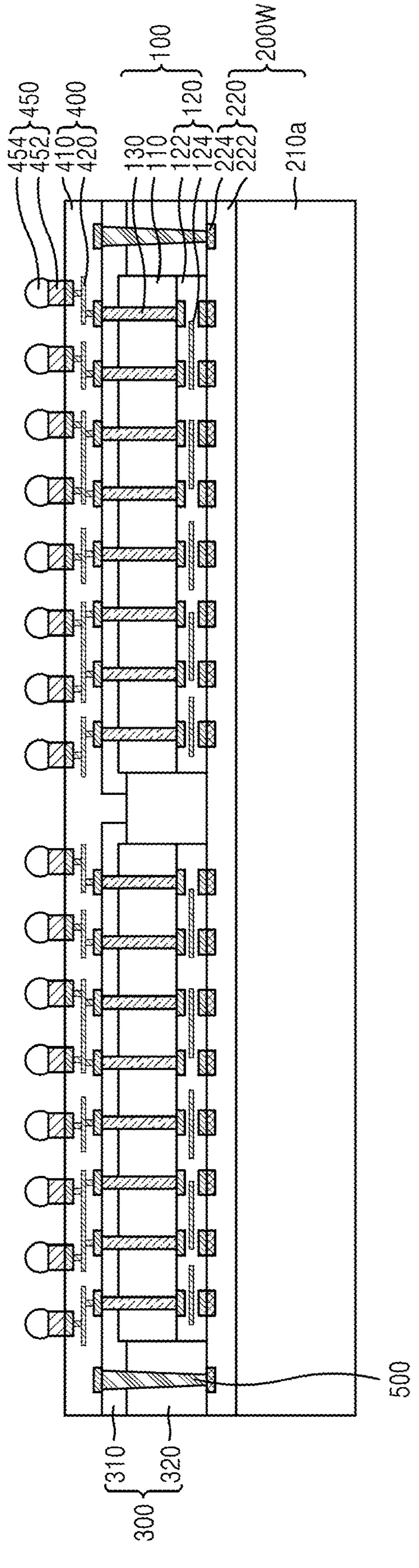
Figure 6D:
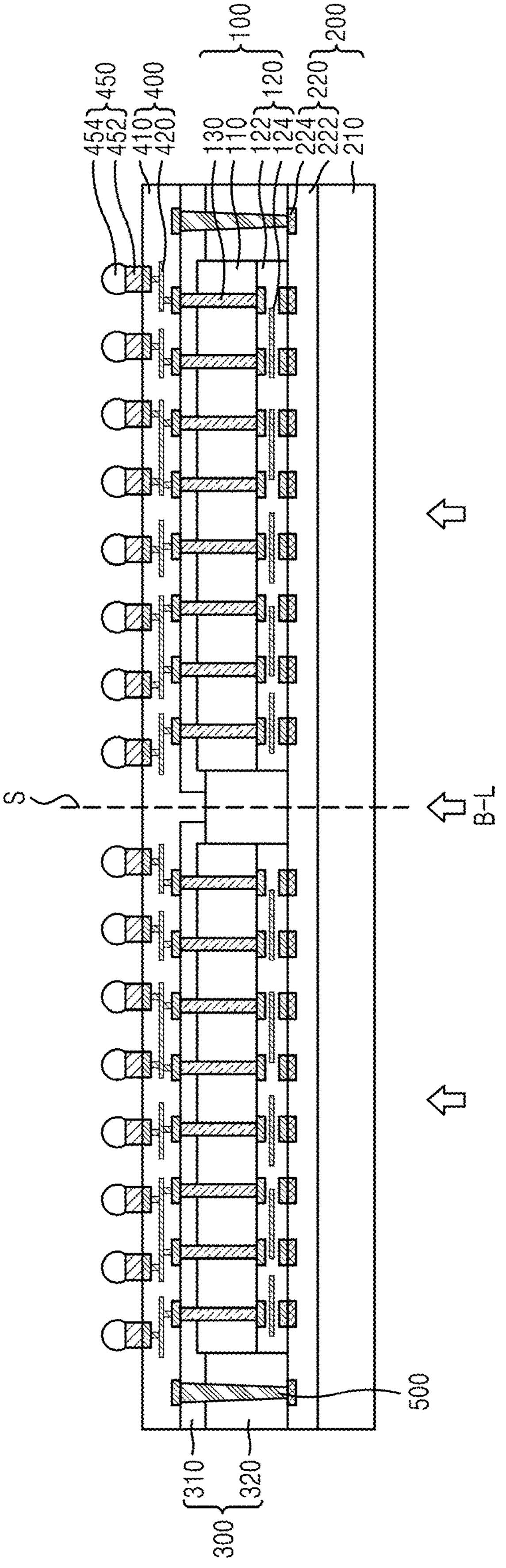

FIGS. 6A and 6D are cross-sectional views schematically illustrating stages in a process of manufacturing the semiconductor package 1000*a* of FIG. 2A. The descriptions already given above with reference to FIG. 2A and given above with reference to FIGS. 5A to 5J are only briefly given or omitted.

Referring to FIG. 6A, in the method for manufacturing the semiconductor package 1000*a* according to the present embodiment, the processes of FIGS. 5A to 5H are previously performed. Thereafter, the through-post 500 penetrating the double gap-fill layer 300 is formed to be adjacent to one side surface of each of the first chips 100. The through-post 500 may be formed by forming a through-hole in the double gap-fill layer 300 and filling the through-hole with a metal material. For reference, in stacking the first chips 100*a* of FIG. 5B by hybrid bonding, an interval between the first chips 100*a* may be appropriately adjusted by considering a position at which the through-post 500 is to be located.

Referring to FIG. 6B, after forming the through-post 500, the redistribution layer 400 is formed on the double gap-fill layer 300. The redistribution layer 400 may include the redistribution insulating layer 410 and the redistribution lines 420. The redistribution lines 420 on the lower surface of the redistribution insulating layer 410, i.e., the upper pad, may be connected to the through-electrode 130 and the through-posts 500. Meanwhile, the redistribution lines 420 on the upper surface of the redistribution insulating layer 410, i.e., the lower pad, may be exposed from the redistribution insulating layer 410.

Referring to FIG. 6C, after forming the redistribution layer 400, the bump 450 is formed on the lower pad that is part of the redistribution lines 420 of the redistribution insulating layer 410. The bump 450 may include, e.g., the pillar 452 and the solder 454.

Referring to FIG. 6D, thereafter, a back-lap process B-L of grinding the rear surface of the wafer 200W is performed to thin the wafer 200W. Thereafter, the wafer 200W and structures on the wafer 200W are individualized through a sawing process S. After the sawing process S, each of the plurality of second chips and a structure corresponding thereto may correspond to the semiconductor package 1000*a* of FIG. 2A.

FIGS. 7A to 7J are cross-sectional views schematically illustrating stages in a process of manufacturing the semiconductor package 1000C of FIG. 3A. The descriptions already given above with reference to FIG. 3A and given above with reference to FIGS. 1A to 6D are briefly given or omitted.

Figure 7A:
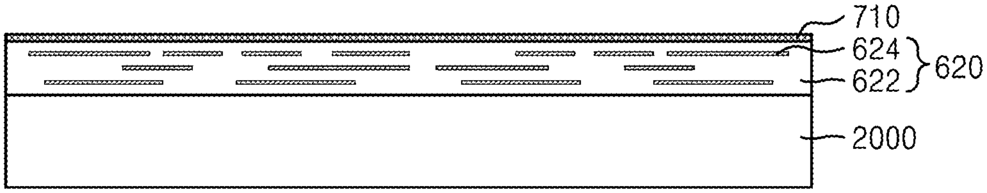
FIGS. 7A to 7J are cross-sectional views schematically illustrating stages in a process of manufacturing the semiconductor package of FIG. 3A.

Referring to FIG. 7A, in the method for manufacturing the semiconductor package 1000*c* according to the present embodiment, first, the first redistribution substrate 620 is formed. As described above, the first redistribution substrate 620 may include the first body insulating layer 622 and the first redistribution lines 624. The first redistribution substrate 620 may be formed on a carrier substrate 2000. The carrier substrate 2000 may be a large-sized substrate, e.g., a wafer. Also, a large-sized redistribution substrate including a plurality of first redistribution substrates 620 may be formed on the carrier substrate 2000.

For reference, after subsequent components are formed on the large-sized redistribution substrate, a semiconductor package that is individualized through a sawing process is referred to as a wafer level package (WLP). However, for convenience of description, only one first redistribution substrate 620 and components corresponding thereto are shown in FIG. 7A and subsequent FIGS. 7B to 7J.

Thereafter, a seed metal 710 is formed on the first redistribution substrate 620. The seed metal 710 may be used in an electroplating process for forming the through-post 700 later. The seed metal 710 may include various metal materials, e.g., Cu, Ti, Ta, TiN, or TaN. In the method for manufacturing a semiconductor package of the present embodiment, e.g., the seed metal 710 may include Cu.

Figure 7B:
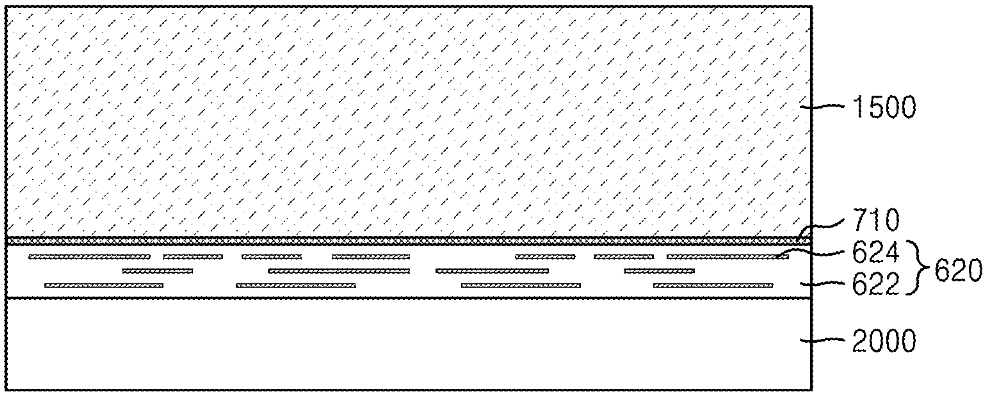

Referring to FIG. 7B, a photoresist (PR) 1500 is subsequently applied on the seed metal 710 of the first redistribution substrate 620. The photoresist 1500 may be applied through a spin coating method using, e.g., a spin coater. The photoresist 1500 may be formed to a thickness corresponding to the height of the through-post 700.

Figure 7C:
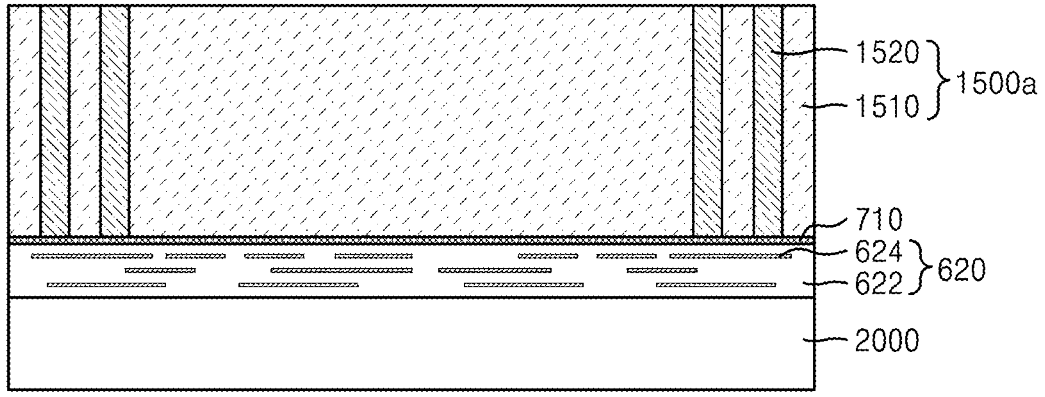

Referring to FIG. 7C, after the photoresist 1500 is applied, an exposure process is performed. The exposure process may be performed using a mask including a certain pattern. For example, a certain portion of the photoresist 1500 may be irradiated with light by transmitting light through a transparent portion of a transmissive mask. The chemical properties of the photoresist portion irradiated with light may be changed. For example, after the exposure process, a photoresist 1500*a* may be divided into an unexposed portion 1510 and an exposed portion 1520. As can be seen from FIG. 7C, the exposed portion 1520 may be located in an outer portion of the first redistribution substrate 620.

Figure 7D:
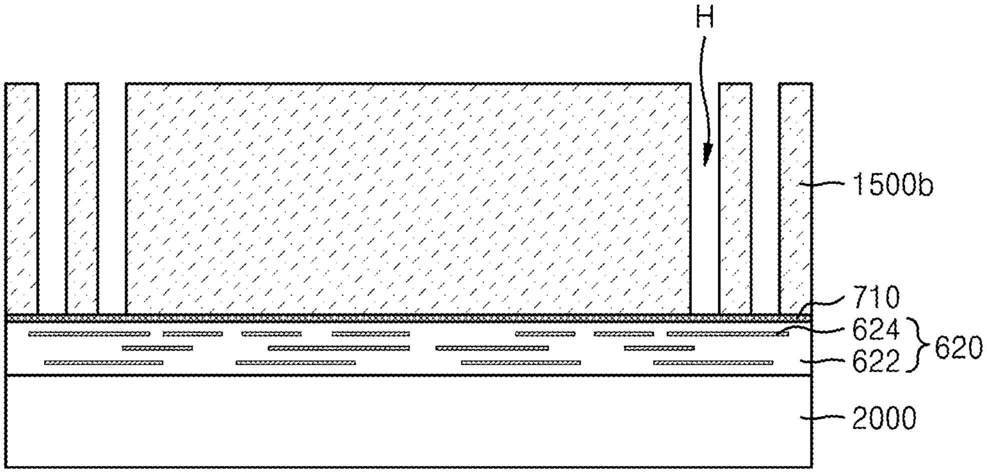

Referring to FIG. 7D, after the exposure process, a developing process is performed on the photoresist 1500*a*. In the developing process, e.g., the exposed portion 1520 may be removed. For example, photoresist 1500*a* may be a positive photoresist. Meanwhile, according to embodiments, negative photoresist may also be used. When negative photoresist is used, an unexposed portion may be removed in the developing process.

By removing the exposed portion 1520 through the developing process, a photoresist pattern 1500*b* may be formed. The photoresist pattern 1500*b* may include a plurality of through-holes H. The seed metal 710 may be exposed from bottom surfaces of the through-holes H. Meanwhile, after the developing process, by-products, e.g., photoresist scum, may remain in the through-holes H. Accordingly, the by-products are removed through a cleaning process. For reference, a process of removing the photoresist scum is referred to as a photoresist descum process. This photoresist descum process may be included in the cleaning process.

Figure 7E:
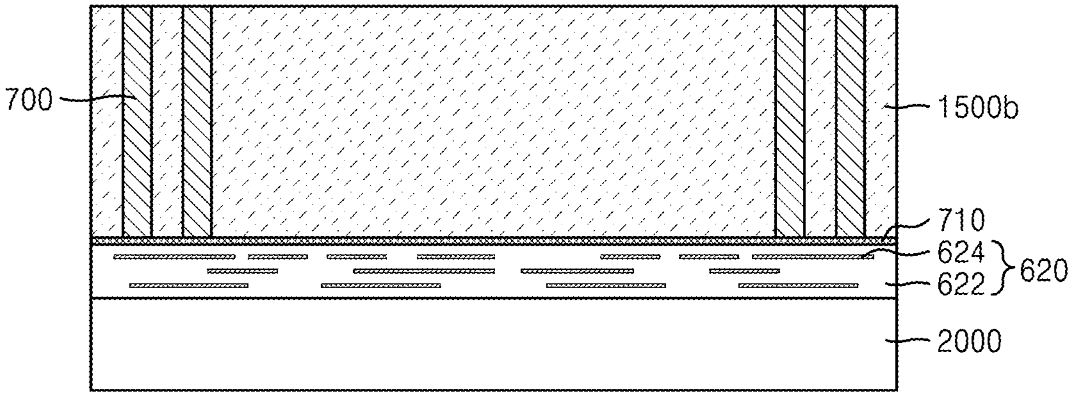

Referring to FIG. 7E, after the cleaning process, the through-post 700 is formed inside the through-holes H through electroplating. The through-post 700 may include, e.g., Cu. Although not shown, the through-post 700 may also be formed on a portion of the upper surface of the photoresist pattern 1500*b* adjacent to the through-hole H, beyond the through-hole H.

Figure 7F:
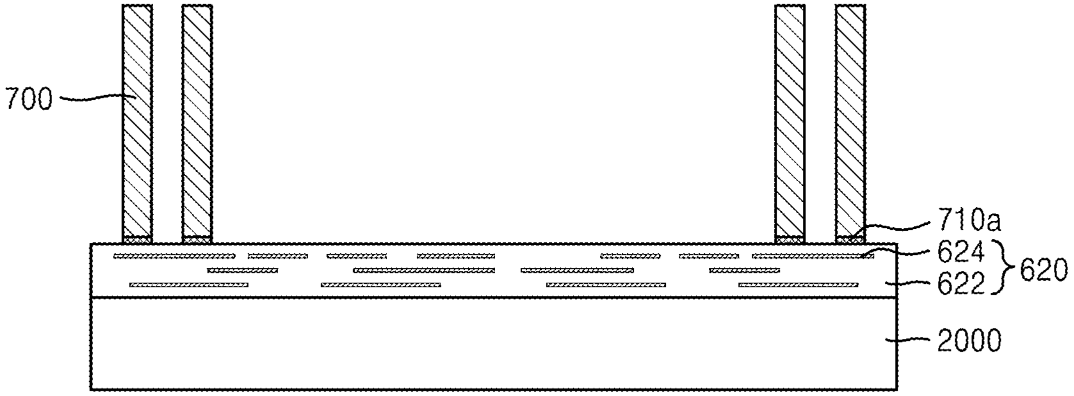

Referring to FIG. 7F, after forming the through-post 700, the photoresist pattern 1500*b* is removed. The photoresist pattern 1500*b* may be removed through an ashing/strip process. After the photoresist pattern 1500*b* is removed, the seed metal 710 may be exposed between the through-posts 700. Subsequently, the seed metal 710 exposed between the through-posts 700 is removed through an etching process. The upper surface of the first redistribution substrate 620 may be exposed between the through-posts 700 through the removal of the seed metal 710. Meanwhile, the seed metal 710*a* on the lower surface of the through-post 700 may be maintained as it is. Because the seed metal 710*a* and the through-post 1700 include the same Cu, the seed metal 710*a* is omitted in FIGS. 7G to 7J.

Figure 7G:
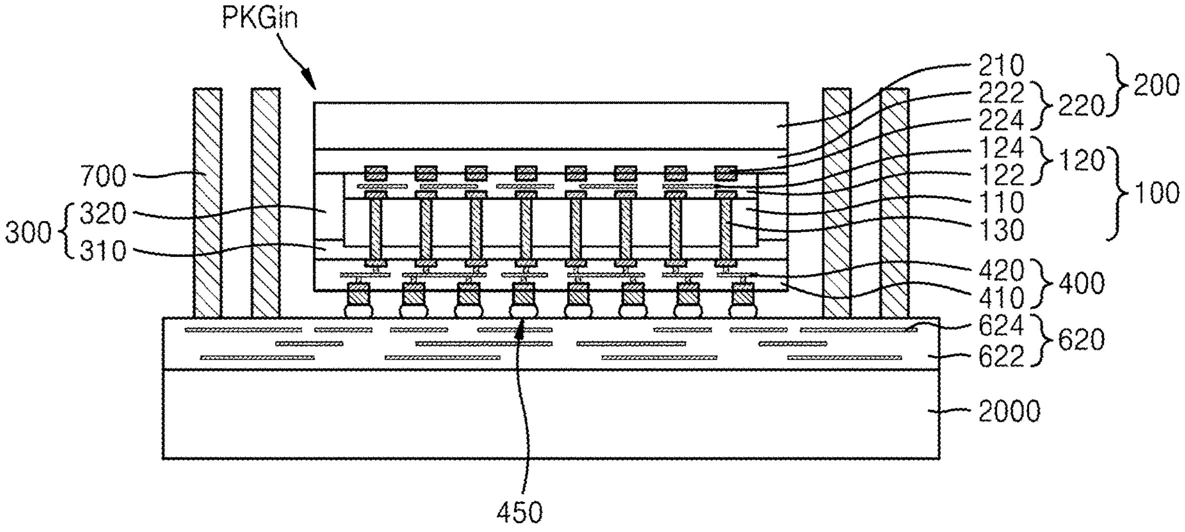

Referring to FIG. 7G, a semiconductor package 1000 of FIG. 1A (hereinafter referred to as 'internal package PKGin' to distinguish the semiconductor package 1000 from the semiconductor package 1000*c* of FIG. 3A) is mounted. The internal package PKGin may be mounted on the first redistribution substrate 620 in a flip-chip structure using the bump 450. According to embodiments, a space between the first redistribution substrate 620 and the internal package PKGin and a space between the bumps 450 may be filled with an underfill.

Figure 7H:
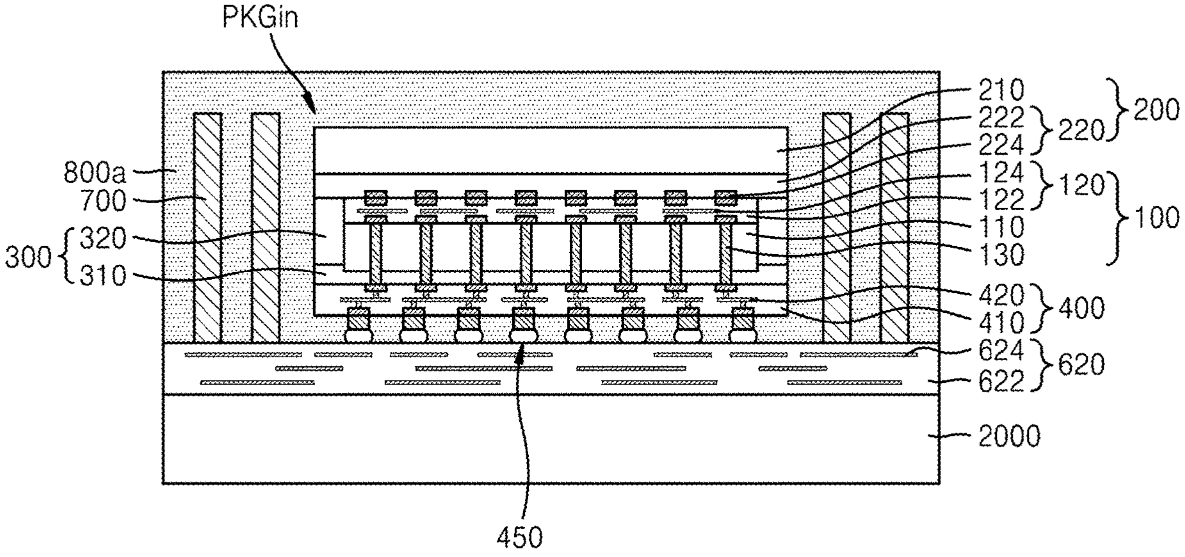

Referring to FIG. 7H, after the internal package PKGin is mounted, the sealant 800*a* covering the internal package PKGin and the through-post 700 is formed on the first redistribution substrate 620. The sealant 800*a* may cover the side surfaces and upper surfaces of the internal package PKGin and the through-post 700. A material of the sealant 800*a* is the same as the sealant 800 of the semiconductor package 1000*c* described above with reference to FIG. 3A.

Figure 7I:
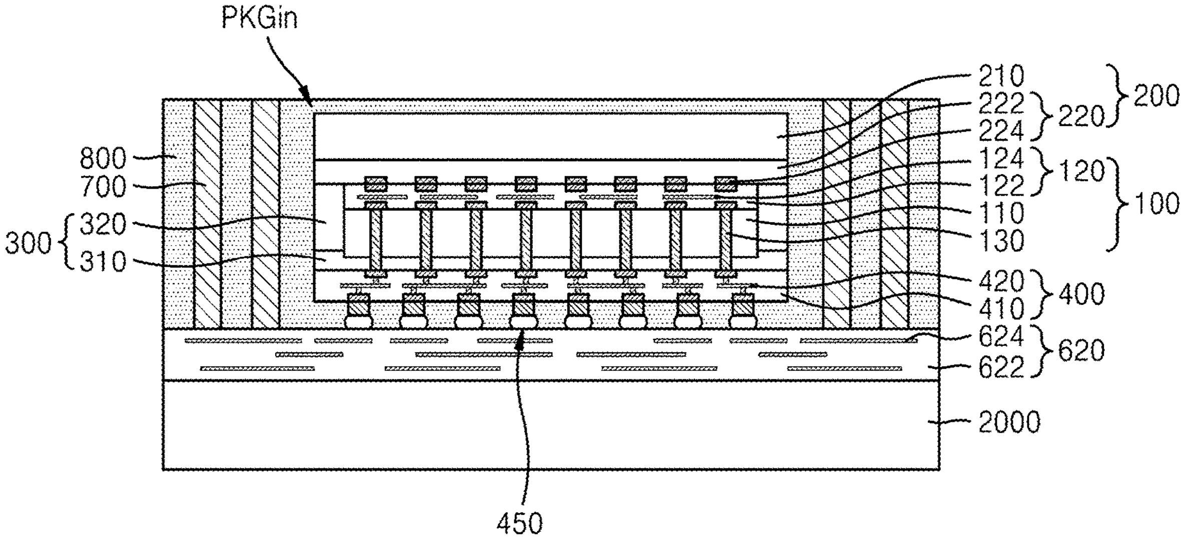

Referring to FIG. 7I, a planarization process of removing an upper portion of the sealant 800*a* is performed. The planarization process may be performed through, for example, CMP. The upper surface of the through-post 700 may be exposed from the sealant 800 through the planarization process of the sealant 800*a*. For example, in the planarization process of the sealant 800*a*, the through-post 700 may act as an etch stop layer. After the planarization process of the sealant 800*a*, the upper surface of the through-post 700 may be substantially coplanar with the upper surface of the sealant 800. Meanwhile, as shown in FIG. 7I, the sealant 800 having a certain thickness may be maintained on an upper portion of the internal package PKGin.

Figure 7J:
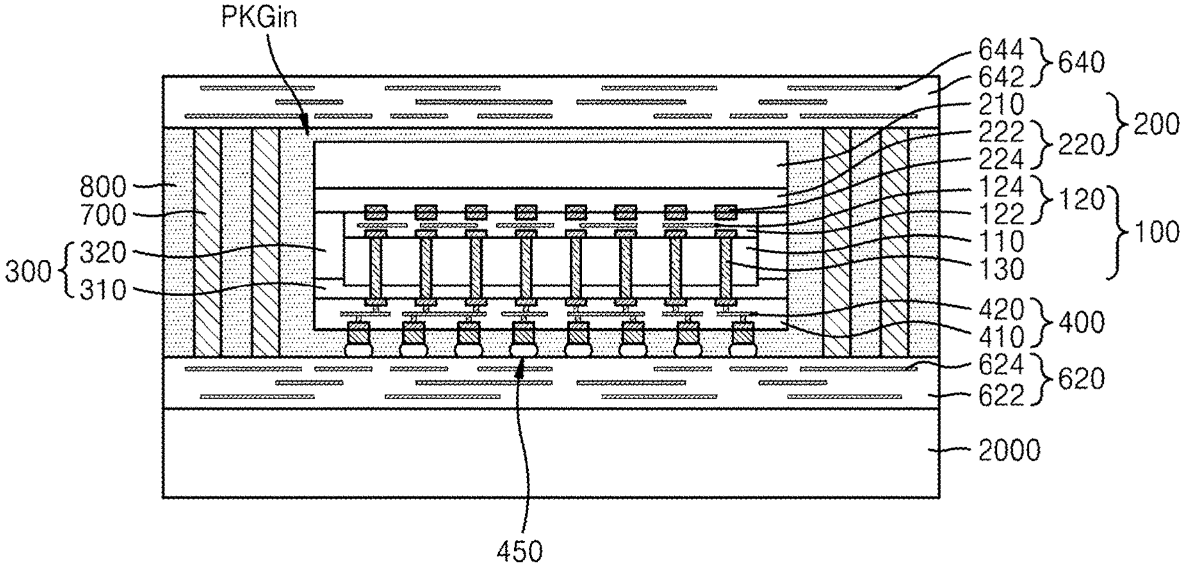

Referring to FIG. 7J, the second redistribution substrate 640 is formed on the through-post 700 and the sealant 800. The second redistribution substrate 640 may include the second body insulating layer 642 and the second redistribution lines 644. The second redistribution line 644 of the second redistribution substrate 640 may be connected to the through-post 700. The rest of the second redistribution substrate 640 is the same as that of the second redistribution substrate 640 of the semiconductor package 1000*c* of FIG. 3A described above.

Thereafter, the carrier substrate 2000 is separated from the first redistribution substrate 620, and the external connection terminal 660 is disposed on the lower surface of the first redistribution substrate 620. The semiconductor package 1000*c* of FIG. 3A may be completed through the arrangement of the external connection terminals 660. Meanwhile, as described above, because the processes of FIGS. 7A to 7J are performed at the wafer level, the semiconductor package 1000*c* of FIG. 3A may be substantially completed through a sawing process of separating the first redistribution substrate of the wafer level and structures corresponding thereto into individual semiconductor packages.

By way of summation and review, embodiments provide a semiconductor package and a method for manufacturing the same, which secure processability, reduce warpage, and improve operation performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:

a first chip including a first substrate, a first wiring layer on an upper surface of the first substrate, and through-electrodes passing through the first substrate and connected to the first wiring layer, the through-electrodes protruding from a lower surface of the first substrate to have protruding portions;

a double gap-fill layer covering a side surface and a lower surface of the first chip;

a second chip on the first chip and the double gap-fill layer, the second chip including a second wiring layer and a second substrate on the second wiring layer, and the second chip being hybrid bonded to the first chip; and at least one bump spaced apart from the lower surface of the first substrate and electrically connected to a corresponding one of the through-electrodes, wherein the double gap-fill layer includes a lower gap-fill layer covering the lower surface and a first portion of the side surface of the first chip and covering the protruding portions of the through-electrodes, and an upper gap-fill layer covering a second portion of the side surface of the first chip, wherein the lower gap-fill layer is formed of a first material, and the upper gap-fill layer is formed of a second material different from the first material.

2. The semiconductor package as claimed in claim 1, wherein the double gap-fill layer includes an organic-inorganic composite material.

3. The semiconductor package as claimed in claim 2, wherein:

the lower gap-fill layer contacts the lower surface and the first portion of the side surface of the first chip and the protruding portions of the through-electrodes, and the upper gap-fill layer contacts the second portion of the side surface of the first chip, the upper gap-fill layer being in contact with the second wiring layer.

4. The semiconductor package as claimed in claim 2, wherein the upper gap-fill layer includes a resin and silica fillers in the resin, the silica fillers having various sizes.

5. The semiconductor package as claimed in claim 2, wherein the lower gap-fill layer includes a polymer.

6. The semiconductor package as claimed in claim 2, wherein:

the first chip has a thickness of about 30 μm to about 40 μm, the lower gap-fill layer has a thickness of about 5 μm to about 10 μm, and the upper gap-fill layer has a thickness of about 10 μm to about 30 μm.

7. The semiconductor package as claimed in claim 1, wherein:

an area of the first chip in a first horizontal plane is smaller than an area of the second chip in a second horizontal plane, and a side surface of the double gap-fill layer is substantially coplanar with a side surface of the second chip.

8. The semiconductor package as claimed in claim 1, wherein:

a redistribution layer is positioned on a lower surface of the double gap-fill layer, and a bump of the at least one bump is connected to one of the through-electrodes through the redistribution layer.

9. The semiconductor package as claimed in claim 8, further comprising a through-post adjacent to the side surface of the first chip, the through-post passing through the double gap-fill layer and connecting the redistribution layer to the second wiring layer.

10. The semiconductor package of claim 1, wherein the lower gap-fill layer contacts the lower surface of the first substrate and a side surface of the first substrate.

11. The semiconductor package of claim 1, wherein the lower gap-fill layer is an epoxy.

12. The semiconductor package of claim 1, wherein the upper gap-fill layer contacts an upper surface of the lower gap-fill layer.

13. The semiconductor package of claim 1, wherein the lower gap-fill layer is conformally deposited to fill a space defined by the lower surface of the substrate and side surfaces of the protruding portions of the through-electrodes.

14. A semiconductor package, comprising:

a first chip including a first substrate, a first wiring layer on an upper surface of the first substrate, and through-electrodes passing through the first substrate and connected to the first wiring layer, the through-electrodes protruding from a lower surface of the first substrate;

a double gap-fill layer including a lower gap-fill layer covering a lower surface of the first chip and a first portion of a side surface of the first chip and protruding portions of the through-electrodes, and an upper gap-fill layer covering a second portion of the side surface of the first chip, the double gap-fill layer including an organic-inorganic composite material;

a second chip on the first chip and the upper gap-fill layer, the second chip including a second wiring layer and a second substrate on the second wiring layer, the second chip being hybrid bonded to the first chip;

a redistribution layer on a lower surface of the double gap-fill layer; and at least one bump on a lower surface of the redistribution layer and connected to at least one of the through-electrodes through a redistribution line of the redistribution layer, wherein the lower gap-fill layer is formed of a first material and the upper gap-fill layer is formed of a second material different than the first material, wherein an area of the first chip in a first horizontal plane is smaller than an area of the second chip in a second horizontal plane, and wherein the upper gap-fill layer covers an area corresponding to a difference between the area of the first chip in the first horizontal plane and the area of the second chip in the second horizontal plane.

15. The semiconductor package as claimed in claim 14, wherein:

the upper gap-fill layer includes a resin and silica fillers in the resin, the silica fillers having various sizes, and the lower gap-fill layer includes a polymer.

16. The semiconductor package as claimed in claim 14, further comprising a through-post adjacent to the side surface of the first chip, the through-post passing through the double gap-fill layer and connecting the redistribution layer to the second wiring layer.

17. The semiconductor package of claim 14, wherein the lower gap-fill layer contacts the lower surface of the first substrate and a side surface of the first substrate.

18. The semiconductor package of claim 14, wherein the lower gap-fill layer is an epoxy.

19. The semiconductor package of claim 14, wherein the upper gap-fill layer contacts an upper surface of the lower gap-fill layer.

* * * * *